US008476925B2

(12) United States Patent
Zhu et al.

(10) Patent No.: US 8,476,925 B2
(45) Date of Patent: Jul. 2, 2013

(54) MAGNETIC SWITCHING CELLS AND METHODS OF MAKING AND OPERATING SAME

(76) Inventors: Jian-Gang (Jimmy) Zhu, Pittsburgh, PA (US); Lawrence T. Pileggi, Pittsburgh, PA (US)

( * ) Notice: Subject to any disclaimer, the term of this patent is extended or adjusted under 35 U.S.C. 154(b) by 0 days.

(21) Appl. No.: 12/898,548

(22) Filed: Oct. 5, 2010

(65) Prior Publication Data

US 2012/0134199 A1    May 31, 2012

Related U.S. Application Data

(63) Continuation-in-part of application No. 12/849,595, filed on Aug. 3, 2010.

(60) Provisional application No. 61/369,743, filed on Aug. 1, 2010.

(51) Int. Cl.
*H03K 19/173*    (2006.01)

(52) U.S. Cl.
USPC .......................................................... 326/38

(58) Field of Classification Search
USPC ................ 326/37–41, 47, 101; 365/171, 173, 365/51, 63, 149, 158
See application file for complete search history.

(56) References Cited

U.S. PATENT DOCUMENTS

| | | | |
|---|---|---|---|
| 6,034,887 A * | 3/2000 | Gupta et al. .................. | 365/171 |
| 7,436,698 B2 * | 10/2008 | Lin et al. ....................... | 365/158 |
| 7,573,736 B2 * | 8/2009 | Wang et al. ................... | 365/158 |
| 7,728,622 B2 | 6/2010 | Chua-Eoan | |
| 8,084,835 B2 * | 12/2011 | Ranjan et al. ................. | 257/421 |
| 8,159,855 B2 * | 4/2012 | Meijier et al. ................ | 365/145 |
| 2005/0078510 A1 * | 4/2005 | Jeong et al. ................... | 365/158 |
| 2006/0083054 A1 * | 4/2006 | Jeong ............................ | 365/158 |
| 2006/0239066 A1 * | 10/2006 | Liaw ............................. | 365/171 |
| 2007/0290717 A1 | 12/2007 | Bangert | |
| 2007/0297222 A1 * | 12/2007 | Leuschner .................... | 365/171 |
| 2008/0094886 A1 * | 4/2008 | Ranjan et al. ................. | 365/171 |
| 2008/0205110 A1 | 8/2008 | Boeve | |
| 2008/0225585 A1 * | 9/2008 | Ranjan et al. ................. | 365/173 |
| 2008/0246104 A1 * | 10/2008 | Ranjan et al. ................. | 257/421 |
| 2008/0278998 A1 | 11/2008 | Cowburn | |
| 2008/0291584 A1 | 11/2008 | Parkin | |
| 2008/0291720 A1 * | 11/2008 | Wang et al. ................... | 365/173 |
| 2009/0135526 A1 | 5/2009 | Dieny | |
| 2009/0290268 A1 | 11/2009 | Xi | |
| 2009/0290408 A1 | 11/2009 | Lou | |
| 2010/0039136 A1 | 2/2010 | Chua-Eoan | |
| 2010/0103730 A1 | 4/2010 | Shin | |
| 2010/0177557 A1 * | 7/2010 | Liu et al. ....................... | 365/158 |
| 2010/0225350 A1 | 9/2010 | Hoeink | |

(Continued)

FOREIGN PATENT DOCUMENTS

| | | |
|---|---|---|
| WO | WO 2011053182 | 5/2011 |
| WO | WO 2011087120 | 7/2011 |

*Primary Examiner* — Shawki S Ismail
*Assistant Examiner* — Thienvu Tran
(74) *Attorney, Agent, or Firm* — David Garrod

(57) ABSTRACT

Logic circuits based, at least in part, on use of spin-torque transfer (STT) to switch the magnetization—and hence the logic state—of a magnetic material are disclosed. Aspects of the invention include novel STT-based switching devices, new configurations of known STT-based devices into useful logic circuits, common logic circuits and system building blocks based on these new devices and configurations, as well as methods for inexpensively mass-producing such devices and circuits.

3 Claims, 36 Drawing Sheets

U.S. PATENT DOCUMENTS

| | | |
|---|---|---|
| 2010/0232219 A1 | 9/2010 | Gibson |
| 2010/0240152 A1 | 9/2010 | Wang |
| 2010/0308378 A1 | 12/2010 | Song |
| 2010/0315123 A1 | 12/2010 | Niemier |
| 2011/0068825 A1 | 3/2011 | Xi |
| 2011/0069536 A1 | 3/2011 | Lou |
| 2011/0115522 A1 | 5/2011 | Javerliac |
| 2011/0141803 A1 | 6/2011 | Kim |
| 2011/0147816 A1 | 6/2011 | Nikonov |
| 2011/0148458 A1 | 6/2011 | Sugibayashi |
| 2011/0149646 A1* | 6/2011 | Liu et al. ............ 365/171 |
| 2011/0149647 A1 | 6/2011 | Kim |
| 2011/0163743 A1 | 7/2011 | Rodmacq |

* cited by examiner

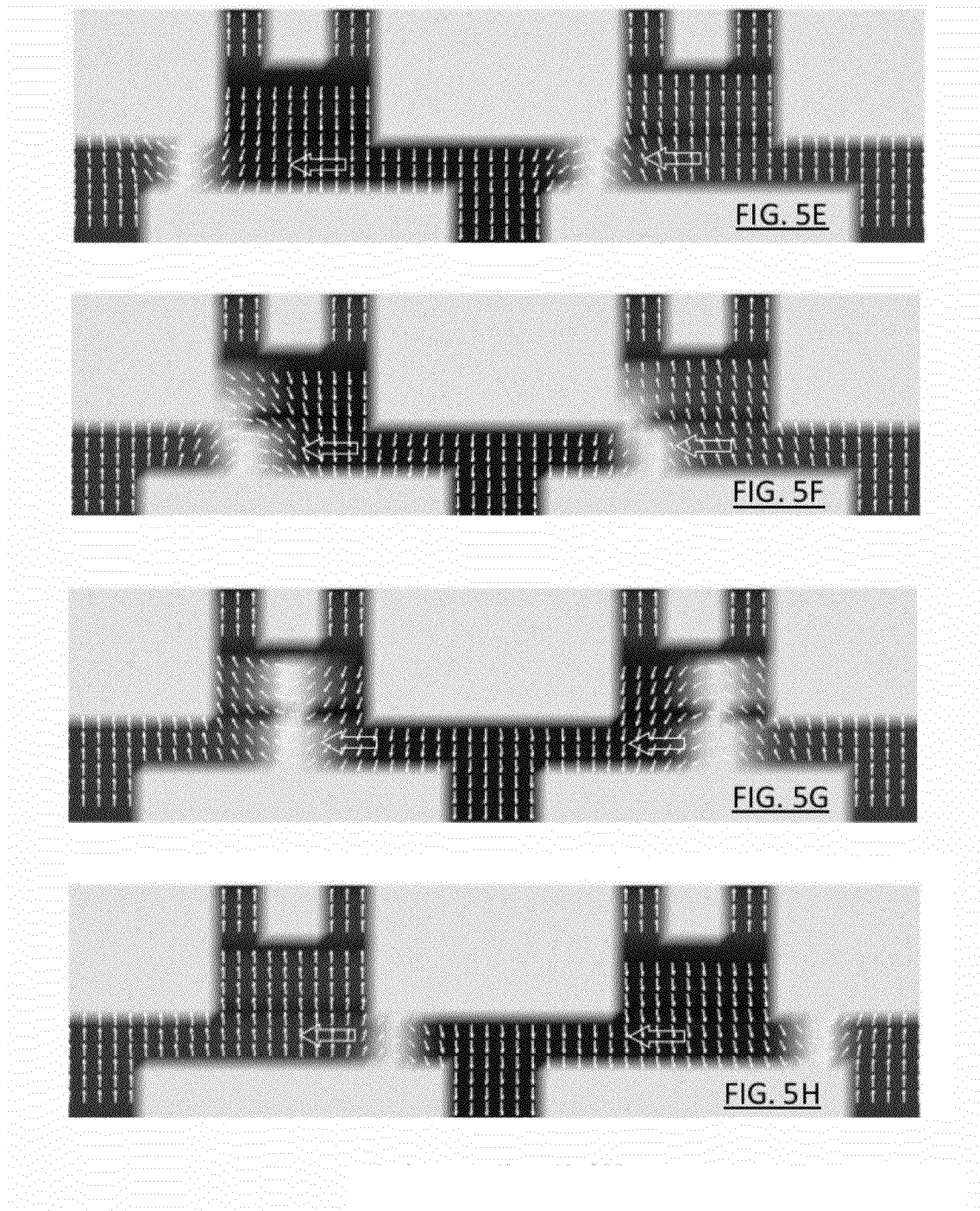

Proposed Schematic Symbol

MAGNETIC SWITCHING CELLS AND METHODS OF MAKING AND OPERATING SAME

CROSS-REFERENCE TO RELATED APPLICATIONS

This application is a continuation-in-part of U.S. patent application Ser. No. 12/849,595, entitled "Magnetic Logic Circuits and Systems Incorporating Same," filed Aug. 3, 2010 by the inventors herein. This application also claims priority from U.S. Provisional Application Ser. No. 61/369,743, entitled "Magnetic Logic Circuits, Integration and Fabrication of Same," filed Aug. 1, 2010 by the inventors herein. These '595 and '743 applications are both incorporated by reference herein.

FIELD OF THE INVENTION

The invention relates generally to logic circuits based, at least in part, on use of spin-torque transfer (STT) to switch the magnetization—and hence the logic state—of a magnetic material. Aspects of the invention disclosed herein include novel STT-based switching devices, new configurations of known STT-based devices into useful logic circuits, common logic circuits and system building blocks based on these new devices and configurations, as well as methods for operating and for inexpensively mass-producing such devices and circuits.

BACKGROUND

For decades, the semiconductor industry has been driven by the tenacious pursuit to double the number of components on a single die every two years. Motivated by simple economics, this unrelenting pursuit of density scaling fueled the exponential growth of the industry. As technology continues to scale, however, it is apparent that power dissipation and density limits are already slowing further improvements with CMOS, and the cost of full-custom design and manufacturing is becoming prohibitive. While there are various post-CMOS technology candidates, it is likely that future integrated systems will be based on a myriad of technologies that are packaged and/or stacked together. The combination of circuits and technologies will be determined by the target application, cost, and required performance.

Nanoscale magnetic devices, such as STT memory devices [see J.-G. Zhu, "Magnetoresistive Random Access Memory: The Path to Competitiveness and Scalability," (Invited Paper) Proceedings of the IEEE, vol. 96, 11, pp. 1786-1798 (2008)], are particularly promising devices for on-chip non-volatile storage. These devices can provide a "disk-like" storage capability for an integrated system while operating at low power levels.

Various attempts and ideas appear in the prior art regarding the possibility of using spin-based magnetic devices as logic switching devices. See, e.g., the following references:

1. S. Bandyopadhyay, et al., "Electron spin for classical information processing: a brief survey of spin-based logic devices, gates and circuits," Nanotechnology, v. 20 (2009), pp. 1-35.
2. B. Behin-Aein, et al., "Proposal for an all-spin logic device with built-in memory," Nature Nanotechnology, vol. 5 (2010), pp. 266-270.
3. D. A. Allwood, et al., "Magnetic domain-wall logic," Science, v. 309 (2005), pp. 1688-1692.
4. C. Chappert, et al., "The emergence of spin electronics in data storage," Nature Materials, v. 6 (2007), pp. 813-823.
5. B. Dieny, et al., "Spin-transfer effect and its use in spintronic components," Int. J. of Nanotechnology, Vol. 7, Nos. 4/5/6/7/8 (2010), pp. 591-614.
6. S. Fukami, et al., "Low-Current Perpendicular Domain Wall Motion Cell for Scalable High-Speed MRAM," 2009 Symposium on VLSI Technology Digest of Technical Papers, pp. 230-31.
7. X. F. Han, et al., "Nano-Scale Patterned Magnetic Tunnel Junction and Its Device Applications," AAPPS Bulletin, v. 18, n. 6 (2008), pp. 24-32.
8. R. K. Kawakami, et al., "Fundamentals of Spintronics in Metal and Semiconductor Systems," in A. Korkin and F. Rosei (eds.), Nanoelectronics and Photonics, Springer (2008), pp. 59-114.
9. J.-P. Nozieres, et al., U.S. Pat. No. 7,518,897 B2, "System and method for providing content-addressable magnetoresistive random access memory cells," (2009).
10. C. Pampuch, et al., "Programmable magnetologic full adder," Applied Physics A, v. 79 (2004), pp. 415-16.
11. G. Reiss, et al., "Magnetic Tunnel Junctions," Springer (2007), pp. 291-333.
12. M. B. Johnson, U.S. Pat. No. 7,209,381 B2, "Signal Processing Device with Disparate Magnetoelectronic Gates" (2007).
13. J. Shen, "Logic Devices and Circuits Based on Giant Magnetoresistance," IEEE Trans. on Magnetics, v. 33, n. 6 (1997), pp. 492-97.
14. H. Shin, PCT Pat. App. No. WO 2009/011,484 A1, "Magnetic Memory Cell."
15. H. Shin, et al., PCT Pat. App. No. WO 2009/104851 A1, "Device for XOR Magneto-Logic Circuit using STT-MTJ."
16. L. G. Chua-Eoan, PCT Pat. App. No. WO 2010/019881 A1, "Gate Level Reconfigurable Magnetic Logic."
17. P. Xu, et al., "An all-metallic logic gate based on current-driven domain wall motion," Nature Nanotechnology, v. 3 (2008).
18. M. Yamanouchi, et al., "Current-induced domain-wall switching in a ferromagnetic semiconductor structure," Nature, v. 428 (2004), pp. 539-542.
19. H. Zabel, "Progress in spintronics," Superlattices and Microstructures, v. 46 (2009), pp. 541-553.
20. W. Zhao, et al., "New non-volatile logic based on spin-MTJ," Physica Status Solidi (a), v. 205, n. 6 (2008), pp. 1373-77.

These references—which are incorporated for their teachings of various details regarding the physical principles on which aspects of the invention operate, as well as for their additional descriptions of various structures, elements, materials, and devices useful in the construction or application of various embodiments of the invention, as well as for their descriptions of various fabrication techniques suitable for use in fabricating embodiments of the invention, or portions thereof—demonstrate a significant, worldwide effort to develop commercially viable magnetic logic devices over the past decade. Nevertheless, as persons skilled in the art acknowledge, this goal has not yet been achieved. See, e.g., Bandyopadhyay, et al. (2009), p. 32 ("In this review, we have attempted to provide a synopsis of our current understanding of those spin-based logic devices, gates and architectures that have attracted the most attention in the engineering and applied physics community. We have found that no spin-based approach is perfect; all have serious shortcomings."); R. K. Kawakami, et al. (2008), p. 63 ("Finally, spintronics has the possibility to deliver high-speed performance and low power consumption, although one should be cautious about making such blanket statements . . . . To sum up, there is potential for high-speed, low-power applications, but novel circuit architectures need to be developed to bring this to fruition.").

OBJECTS AND SUMMARY OF THE INVENTION

In light of the above, a preferred form of the invention seeks to provide digital logic and finite state machines implemented exclusively, or nearly exclusively, using STT devices, thereby enabling powerful, energy-efficient integrated systems that are otherwise unattainable.

To this end, the incorporated '595 and '743 applications disclosed a new class of STT-based magnetic switching devices (herein called "mCells") that provide electrical isolation between their programming and evaluation paths, thereby enabling efficient, reliable, and cost-effective implementation of a wide variety of logic circuits. This application provides additional refinements of the mCell concept disclosed in the '595 and '743 applications.

Also, as disclosed in the incorporated '595 and '743 applications, mCell-based logic systems can be realized in various styles, including passive load (either resistive or fixed-input mCell) designs and active load (complimentary) designs, any of which may employ single-ended or differential circuit architectures.

Further objects of this invention relate to methods of operating mCells and circuits/systems that utilize them.

Still further objects of the invention relate to processes, techniques, apparatus and materials for efficiently mass-producing mCells and mCell-based logic systems.

In light of the above, generally speaking, and without intending to be limiting, an mCell in accordance with one aspect of this invention comprises (i) first and second programming terminals (generally designated $a^-$ and $a^+$) for switching the mCell between its low and high resistance states in response to currents that flow between the terminals and (ii) first and second evaluation terminals (generally designated A and A') that (a) present a first, lower resistance when the mCell is in its low resistance state and (b) present a second, higher resistance when the mCell is in its high resistance state. An mCell in accordance with this aspect of the invention further comprises first and second magnetized programming electrodes (also referred to as magnetic studs) electrically coupled to the respective first and second programming terminals, the first programming electrode has a magnetization that is substantially opposite in direction to the magnetization of the second programming electrode. An mCell in accordance with this aspect of the invention further comprises a magnetic switching layer made from a conductive material (preferably, one with sufficient perpendicular magnetic anisotropy that the magnetization will naturally be oriented along its perpendicular direction, i.e., the perpendicular magnetic anisotropy should preferably exceed the demagnetization energy due to the perpendicular magnetization). In mCells according to this aspect of the invention, the magnetic switching layer comprises (i) a first region that is adjacent (in the sense of being "near," not necessarily touching) the first programming electrode, (ii) a second region that is adjacent the second programming electrode, and (iii) a domain switching region located between the first and second regions. In mCells according to this aspect of the invention, the first region of the magnetic switching layer is electrically coupled to the first programming electrode such that current can flow between the first region and the first programming electrode; the first region is also magnetically coupled with the first programming electrode such that the magnetization in the first region is pinned by the magnetization of the first programming electrode; the second region of the magnetic switching layer is electrically coupled to the second programming electrode such that current can flow between the second region and the second programming electrode; the second region is also magnetically coupled with the second programming electrode such that the magnetization in the second region is pinned by the magnetization of the second programming electrode. In mCells according to this aspect of the invention, the pinned, opposing magnetizations in the first and second regions of the magnetic switching layer create a domain wall in the domain switching region of the magnetic switching layer; the magnetic switching layer is configured such that (i) currents (of sufficient magnitude) that flow from the first programming electrode to the second programming electrode will cause the domain wall to position itself proximate to the first region of the magnetic switching layer, which will in turn cause most of the domain switching region to assume the magnetization of the second region and cause the mCell to assume its low resistance state, and (ii) currents (of sufficient magnitude) that flow from the second programming electrode to the first programming electrode will cause the domain wall to position itself proximate to the second region of the magnetic switching layer, which causes most of the domain switching region to assume the magnetization of the first region and causes the mCell to assume its high resistance state. In mCells according to this aspect of the invention, a switchable magnetic evaluation layer is electrically isolated from, but magnetically coupled with, the domain switching region of the magnetic switching layer; as a result of the magnetic coupling, the switchable magnetic evaluation layer follows the magnetization of the domain switching region of the magnetic switching layer. Furthermore, at least a first magnetized evaluation electrode is provided; the first evaluation electrode is electrically coupled between the first evaluation terminal and one end of the magnetic evaluation layer (an optional second magnetic evaluation electrode is electrically coupled between the second evaluation terminal and the other end of the magnetic evaluation layer); at least one magnetic tunnel junction (MTJ) is additionally interposed between at least the first evaluation electrode and the magnetic evaluation layer (an additional tunnel junction may be interposed between the second evaluation electrode, if present, and the magnetic evaluation layer); consequently, currents that flow between the two evaluation terminals via the magnetic evaluation layer necessarily pass through the at least one tunnel junction.

Again, generally speaking, and without intending to be limiting, a complimentary magnetic switching cell (c-mCell) in accordance with another aspect of the invention comprises a first programming terminal, a second programming terminal, a first magnetized programming electrode electrically coupled to the first programming terminal, a second magnetized programming electrode electrically coupled to the second programming terminal, with the second programming electrode having a magnetization substantially the same as that of the first programming electrode. A c-mCell according to this aspect of the invention further includes an intermediate magnetized programming electrode, where the intermediate programming electrode has a magnetization substantially opposite to that of the first and second programming electrodes. A c-mCell according to this aspect of the invention also includes a magnetic switching layer made from a conductive material with perpendicular magnetic anisotropy; such magnetic switching layer preferably includes (i) a first region adjacent (again, in the "near" sense) the first programming electrode, (ii) a second region adjacent the second programming electrode, (iii) an intermediate region adjacent the intermediate programming electrode, (iv) a first domain switching region located between the first and intermediate regions, and (v) a second domain switching region located between the second and intermediate regions. In a c-mCell according to this aspect of the invention, the first region of the magnetic switching layer is electrically coupled to the first programming electrode so that current can flow between the first region and said first programming electrode; the first region of the magnetic switching layer and the first programming electrode are also magnetically coupled so that the magnetization in the first region is pinned by the magnetization of the first programming electrode. Furthermore, in a c-mCell according to this aspect of the invention, the second region of the magnetic switching layer is electrically coupled to the second programming electrode so that current can flow between the second region and the second programming electrode; the second region of the magnetic switching layer and the second programming electrode are also magnetically coupled so that the magnetization in the second region is pinned by the magnetization of the second programming electrode. Additionally, in a c-mCell according to this aspect of the invention, the intermediate region of the magnetic switching layer is at least magnetically coupled with the intermediate programming electrode so that the magnetization in the intermediate region is pinned by the magnetization of the intermediate programming electrode. In a c-mCell according to this aspect of the invention, the pinned, opposing magnetizations in the first and intermediate regions of the magnetic switching layer create a first domain wall in the first domain switching region of the magnetic switching layer; the magnetic switching layer configured such that (i) currents (of sufficient magnitude) that flow from the first programming electrode to the second programming electrode cause the first domain wall to position itself (or maintain its position) proximate to the first region of the magnetic switching layer, which causes most of the first domain switching region to assume the magnetization of the intermediate region and causes the c-mCell to assume (or maintain) a first output state, and (ii) currents that flow from the second programming electrode to the first programming electrode cause the first domain wall to position itself proximate to the intermediate region of the magnetic switching layer, which causes most of the first domain switching region to assume the magnetization of the first region and assists the c-mCell in maintaining a second output state. Also, in a c-mCell according to this aspect of the invention, the pinned, opposing magnetizations in the second and intermediate regions of the magnetic switching layer create a second domain wall in the second domain switching region of the magnetic switching layer; the magnetic switching layer is also configured such that (i) the currents that flow from the second programming electrode to the first programming electrode cause the second domain wall to position itself proximate to the second region of the magnetic switching layer, which causes most of the second domain switching region to assume the magnetization of the intermediate region and assists the c-mCell in maintaining the first output state, and (ii) the currents that flow from the first programming electrode to the second programming electrode cause the second domain wall to position itself proximate to the intermediate region of the magnetic switching layer, which causes most of the second domain switching region to assume the magnetization of the second region and causes the c-mCell to assume (or maintain) the second output state. A c-mCell according to this aspect of the invention further comprises a first switchable magnetic evaluation layer that is electrically isolated from, and magnetically coupled to, the first domain switching region of the magnetic switching layer, such that the first switchable magnetic evaluation layer follows the magnetization of the first domain switching region of the magnetic switching layer. A c-mCell according to this aspect of the invention further includes first and/or second magnetized evaluation electrode(s); the first evaluation electrode (if present) is electrically coupled between a first (+/−) supply terminal and the first magnetic evaluation layer; the second evaluation electrode (if present) is electrically coupled between an output terminal and the first magnetic evaluation layer; at least one first magnetic tunnel junction is interposed between at least one of the first and/or second evaluation electrodes and the first magnetic evaluation layer, such that currents which flow between the first supply terminal and the output terminal through the first magnetic evaluation layer pass through the at least one first tunnel junction. A c-mCell according to this aspect of the invention further includes a second switchable magnetic evaluation layer that is electrically isolated from, and magnetically coupled to, the second domain switching region of the magnetic switching layer, such that the second switchable magnetic evaluation layer follows the magnetization of the second domain switching region of the magnetic switching layer. A c-mCell according to this aspect of the invention further includes third and/or fourth magnetized evaluation electrode(s); the fourth evaluation electrode (if present) is electrically coupled between a second (−/+, i.e., opposite in polarity to the first) supply terminal and the second magnetic evaluation layer; the third evaluation electrode (if present) is electrically coupled between the output terminal and the second magnetic evaluation layer; at least one second magnetic tunnel junction is interposed between at least one of the third and/or fourth evaluation electrodes and the second magnetic evaluation layer, such that currents which flow between the second supply terminal and the output terminal through the second magnetic evaluation layer pass through the at least one second tunnel junction.

Again, generally speaking, and without intending to be limiting, a method of operating an mCell in accordance with another aspect of the invention uses an mCell that has at least first and second programming terminals and first and second evaluation terminals, and that is capable of maintaining at least low and high resistance states. A method in accordance with this aspect of the invention comprises performing at least steps A-D, each at least once but in any sequence or repetition (e.g., ABCD, DAACDDDB, etc.), all while maintaining electrical isolation between the programming terminals and the evaluation terminals (i.e., no current paths between any input terminal and any evaluation terminal). Step A, in accordance with this aspect of the invention, comprises switching the mCell from its high to low resistance state by inducing movement of a magnetic domain wall from a first position to a second position in response to a first programming current that flows from the first programming terminal to the second programming terminal. Step B, in accordance with this aspect of the invention, comprises switching the mCell from its low to high resistance state by inducing movement of a magnetic domain wall from the second position to the first position in response to a second programming current that flows from the second programming terminal to the first programming terminal. Step C, in accordance with this aspect of the invention, comprises evaluating the mCell in its low resistance state by flowing a first evaluation current between the first and second evaluation terminals via at least first and second magnetized regions of the mCell, while maintaining substantially aligned magnetizations in the first and second regions. Step D, in accordance with this aspect of the invention, comprises evaluating the mCell in its high resistance state by flowing a second evaluation current between the first and second evaluation terminals via at least the first and second magnetized regions of the mCell, while maintaining substantially opposite magnetizations in the first and second regions. A method in accordance with this aspect of the invention preferably further includes magnetically coupling from a switchable region located between the first and second domain wall positions to the second magnetized region, such that the direction of magnetization in the second magnetized region follows the direction of magnetization in the switchable region. Such coupling may comprise magnetic field switching, exchange coupled switching, or a combination of the two. A method in accordance with this aspect of the invention preferably further includes providing an energy barrier in the switchable region that urges the domain wall to settle at the first position or the second position, but not at intermediate positions between the two.

Again, generally speaking, and without intending to be limiting, a method of operating a c-mCell in accordance with another aspect of the invention uses a c-mCell that has at least first and second programming terminals and first and second supply terminals, and that is capable of maintaining at least first and second states. A method in accordance with this aspect of the invention comprises performing at least steps A-D, each at least once but in any sequence or repetition, all while maintaining electrical isolation between the programming terminals and the supply terminals. Step A, in accordance with this aspect of the invention, comprises switching the c-mCell from its first to second state by simultaneously inducing movement of (i) a first magnetic domain wall from a first position to a second position in response to a first programming current that flows from the first programming terminal to the second programming terminal and (ii) a second magnetic domain wall from a third position to a fourth position in response to said first programming current. Step B, in accordance with this aspect of the invention, comprises switching the c-mCell from its second to first state by simultaneously inducing movement of (i) the first magnetic domain wall from the second position to the first position in response to a second programming current that flows from the second programming terminal to the first programming terminal and (ii) the second magnetic domain wall from the fourth position to the third position in response to said second programming current. Step C, in accordance with this aspect of the invention, comprises evaluating the c-mCell in its first state by flowing a first evaluation current between the first and second supply terminals via at least successive first, second, third, and fourth magnetized regions of the mCell (additional magnetic regions may exist between these regions), while maintaining substantially aligned magnetizations in the first and second regions, substantially opposite magnetizations in the third and fourth regions, and sampling the state of the c-mCell at an output terminal located between the second and third magnetized regions. Step D, in accordance with this aspect of the invention, comprises evaluating the c-mCell in its second state by flowing a second evaluation current between the first and second supply terminals via the successive first, second, third, and fourth magnetized regions of the mCell, while maintaining substantially aligned magnetizations in the third and fourth regions, but substantially opposite magnetizations in the first and second regions, and sampling the state of the c-mCell at the output terminal. In methods according to this aspect of the invention, flowing currents between the first and second supply terminals involves flowing said currents across a first MJT located between the first and second regions and a second MJT located between the third and fourth regions. Methods according to this aspect of the invention preferably further comprise simultaneously magnetically coupling (i) from a first switchable region located between the first and second domain wall positions to said first or second magnetized region, thereby causing the direction of magnetization in said first or second magnetized region to follow the direction of magnetization in the first switchable region and (ii) from a second switchable region located between the third and fourth domain wall positions to said third or fourth magnetized region, thereby causing the direction of magnetization in said third or fourth magnetized region to follow the direction of magnetization in the second switchable region. In methods according to this aspect of the invention, such magnetic coupling may comprise magnetic field switching, exchange coupled switching, or a combination of the two. Additionally, methods according to this aspect of the invention preferably further comprise providing energy barriers in the first and second switchable regions that urge the domain walls to settle at the first, second, third or fourth positions, but not at intermediate positions between the first and second or third and fourth positions.

Still other aspects of the invention relate to magnetic logic circuits and devices, as described above, in combination with other circuitry such as CMOS circuits and/or MRAM storage devices, as well as implementations of the above that can operate using scavenged or intermittent power. The interconnection between the aforementioned magnetic logic circuits and other circuitry can be achieved by interconnecting two chips, stacking and bonding one chip onto another, or by directly integrating the magnetic logic materials onto the other circuitry's substrate.

BRIEF DESCRIPTION OF THE DRAWINGS

Aspects of the above—as well as other—objects, features, advantages, and applications of the invention are depicted in the accompanying set of figures, in which:

FIGS. 5E-H depict a further micro-magnetic simulation of the c-mCell inverter (or buffer) in which a ins (right-to-left) current pulse causes domain walls in the respective left and right mCells to relocate to the right side of their respective cells, thus causing the left mCell to assume its lower-resistance state and the right mCell to assume its higher-resistance state;

DESCRIPTION OF ILLUSTRATIVE EMBODIMENTS

Figure 1A:
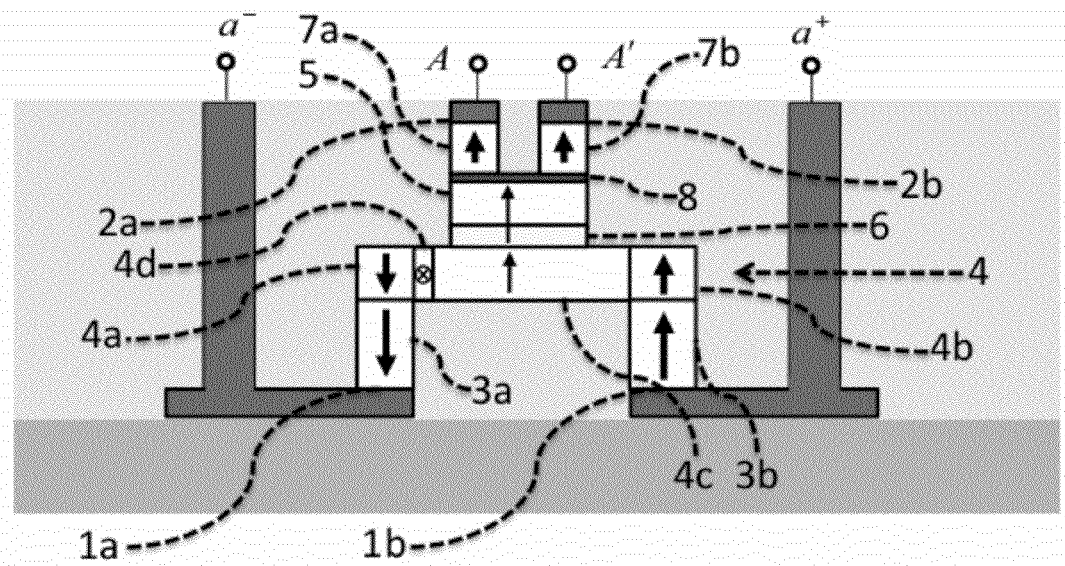
FIGS. 1A-B depict an illustrative magnetic switching cell (mCell) in accordance with the invention in its low- and high-resistance states, respectively.

As previously noted, certain aspects of the instant invention relate to a new magnetic switching cell (mCell) that provides electrical isolation between the current paths used to program—vs. evaluate the state of—the device. Relevant structural and operational features of the inventive mCell are best appreciated with reference to FIGS. 1A-B, which respectively depict an illustrative mCell in its lower-resistance and higher-resistance states. The mCell is a 4-terminal device. As depicted, the mCell includes first and second programming terminals ($1a$ and $1b$) that are used to apply currents to switch the mCell between its lower- and higher-resistance states. The mCell also includes first and second evaluation terminals ($2a$ and $2b$) that present a first, lower resistance when the mCell is in its lower-resistance state, and a second, higher resistance when the mCell is in its higher-resistance state. [Based on current technology, the terminal-to-terminal resistance in the lower-resistance state is approximately 5000 ohms, whereas the resistance in the higher-resistance state is approximately 15,000 ohms for an mCell device with 20 nm length and width.]

A programming path of the illustrative mCell includes first and second permanently magnetized programming electrodes ($3a$ and $3b$). [These electrodes are preferably made of magnetic materials with perpendicular anisotropy, such as Co/Pt, Co/Pd, and Co/Ni, multilayer structured thin films, or Co thin films, CoPt and CoCrPt alloys, MgAl-L1$_0$, CoPt-L1$_0$, and FePt-L1$_0$, atomically ordered thin films, but can alternatively be made of NiFe/IrMn, NiFe/NiMn, NiFe/PtMn, NiFe/NiO, CoFe/IrMn, CoFe/NiMn, CoFe/PtMn, NiFe/NiO. Underlayer(s), such as NiW/Ru, Ru, and Pt/Ru, could be used to ensure adequate crystalline orientation. Magnetic multilayer Co/Pt, Co/Pd, Co/Ni, or Co/Cu, can be also used for the studs.] Programming electrodes ($3a$-$b$) are electrically coupled to the respective first and second programming terminals ($1a$-$b$). The first programming electrode has a magnetization substantially opposite to that of the second programming electrode (as depicted by the oppositely oriented arrows in boxes $3a$-$b$). The illustrative programming path also includes a magnetic switching layer (4) made from a conductive material with perpendicular magnetic anisotropy. [The preferred material for this layer is FePt or CoPt L10 ordered film, but it can also be formed from Co/Pt, or Co/Ni, or Co/Pd multilayer structured film. Since the interfacial magnetic anisotropy arising from the top or bottom interface of the domain wall switching layer can also be utilized to yield significant overall perpendicular anisotropy, CoFe, CoFeB, Co-based alloys, or Fe-based alloys can also be used for this layer.] This magnetic switching layer (4) includes a first region ($4a$) adjacent to the first programming electrode ($3a$), a second region ($4b$) adjacent to the second programming electrode ($3b$), and a domain switching region ($4c$) located between the first and second regions ($4a$-$b$).

The first region ($4a$) of the magnetic switching layer is electrically coupled to the first programming electrode ($3a$) so that current can flow between the first region and the first programming electrode. The first region ($4a$) is also magnetically coupled to the first programming electrode ($3a$) so that the magnetization in the first region is pinned by the permanent magnetization of the first programming electrode (this is depicted by the arrows in $4a$ and $3a$, showing that both regions display substantially the same direction of magnetization). Similarly, the second region ($4b$) of the magnetic switching layer is electrically coupled to the second programming electrode ($3b$) so that current can flow between the second region and the second programming electrode. The second region ($4b$) is also magnetically coupled to the second programming electrode ($3b$) so that the magnetization in the second region is pinned by the permanent magnetization of the second programming electrode (this is depicted by the arrows in $4b$ and $3b$, showing that both regions display substantially the same direction of magnetization).

The pinned, opposing magnetizations in the first and second regions ($4a$-$b$) of the magnetic switching layer (4) create a domain wall (4d) in the domain switching region (4c) of the magnetic switching layer. The magnetic switching layer (4) is configured so that currents flowing from the first programming electrode (3a) to the second programming electrode (3b) cause the domain wall (4d) to position itself proximate to the first region (4a) of the magnetic switching layer (4), thereby causing most of the domain switching region (4c) to assume the magnetization of the second region (4b); this causes the mCell to assume its lower-resistance state. Similarly, currents flowing from the second programming electrode (3b) to the first programming electrode (3a) cause the domain wall (4d) to position itself proximate to the second region (4b) of the magnetic switching layer (as depicted in FIG. 1B). This causes most of the domain switching region (4c) to assume the magnetization of the first region (4a), which causes the mCell to assume its higher-resistance state.

Referring again to FIG. 1A, the exemplary mCell also includes an evaluation path that includes a switchable magnetic evaluation layer (5). This layer (5) is electrically isolated from the structures that make up the programming path by, for example, an insulating ferromagnetic or ferrimagnetic layer (6). [The insulating layer can be either magnetic or non-magnetic in nature. The insulating layer can be used to provide an adequate ferromagnetic (or antiferromagnetic, or antiparallel) coupling between the domain wall switching layer and the lower magnetic electrode of the MTJ. The insulating coupling layer can be either a thin layer of non-magnetic electrically-insulating material or a layer of magnetic electrically-insulating material, or a combination of the two in a multilayer structure. The potential materials to be used for this layer include Fe-oxide, $CrO_x$, $CoO_x$, $SiO_x$, SiNx, $TiN_x$, MgO, and TiC.] The switchable magnetic evaluation layer (5) is also magnetically coupled to the domain switching region (4c) of the magnetic switching layer, such that the magnetization of the switchable magnetic evaluation layer follows the magnetization of the domain switching region of the magnetic switching layer (this is illustrated in FIG. 1a, where 5 follows the up magnetization of 4c, and in FIG. 1b, where 5 follows the down magnetization of 4c).

The evaluation path also includes first and (optional) second permanently magnetized evaluation electrodes (7a-b). The first evaluation electrode (7a) is electrically coupled between the first evaluation terminal (2a) and the magnetic evaluation layer (5), and the (optional) second evaluation electrode (7b) is electrically coupled between the second evaluation terminal (2b) and the magnetic evaluation layer (5). At least one magnetic tunnel junction (shown as two junctions created by layer 8 in FIGS. 1A-B) is/are interposed between at least one of the evaluation electrodes (7a-b) and the magnetic evaluation layer (5), so that currents which flow between the evaluation terminals (2a-b) through the magnetic evaluation layer (5) pass through the at least one tunnel junction. [The materials for the upper and lower magnetic electrodes of the MTJ can be a magnetic multilayer that consists of CoFeB and a magnetic layer with sufficient perpendicular magnetic anisotropy, with CoFeB layers sandwiching a tunnel barrier which is usually MgO. The tunnel barrier can also be other tunnel barriers such as $AlO_x$. In alternative embodiments, the tunnel junction(s) in the evaluation path can be replaced by one or more non-magnetic metallic interlayer(s), such as Cu, Cr.]

Figure 1B:
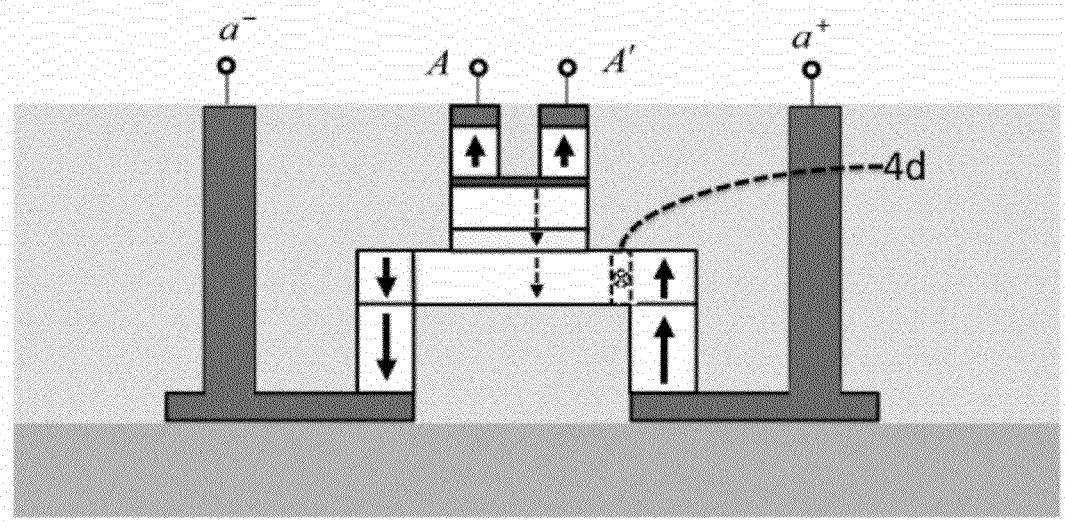
Figure 2A:
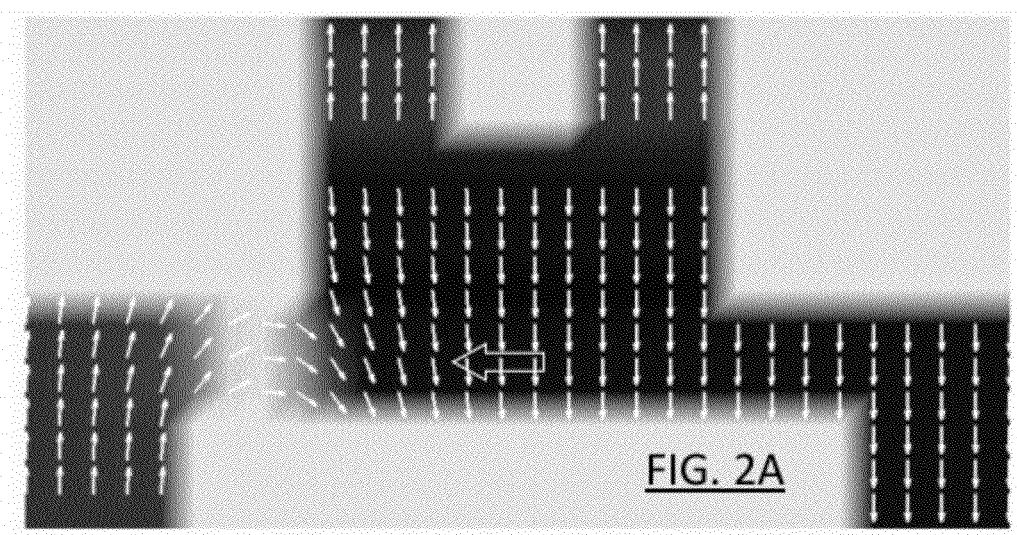
FIGS. 2A-F depict a micro-magnetic simulation of an exemplary mCell device in which a 1 ns (right-to-left) current pulse across the mCell's domain switching layer causes the domain wall to reposition itself proximate to the right-side pinned region, which causes the device to assume its lower-resistance state.
Figure 2B:
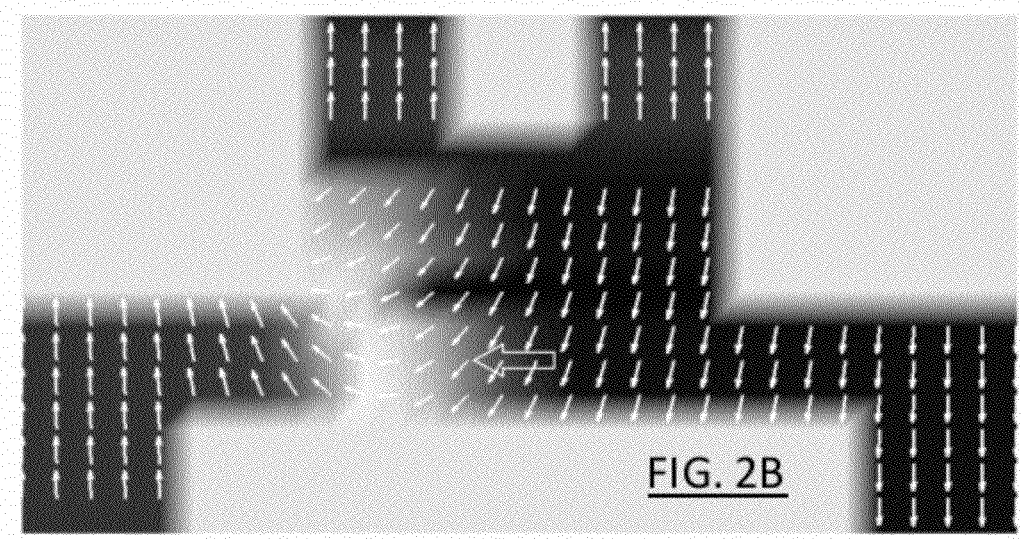
Figure 2C:
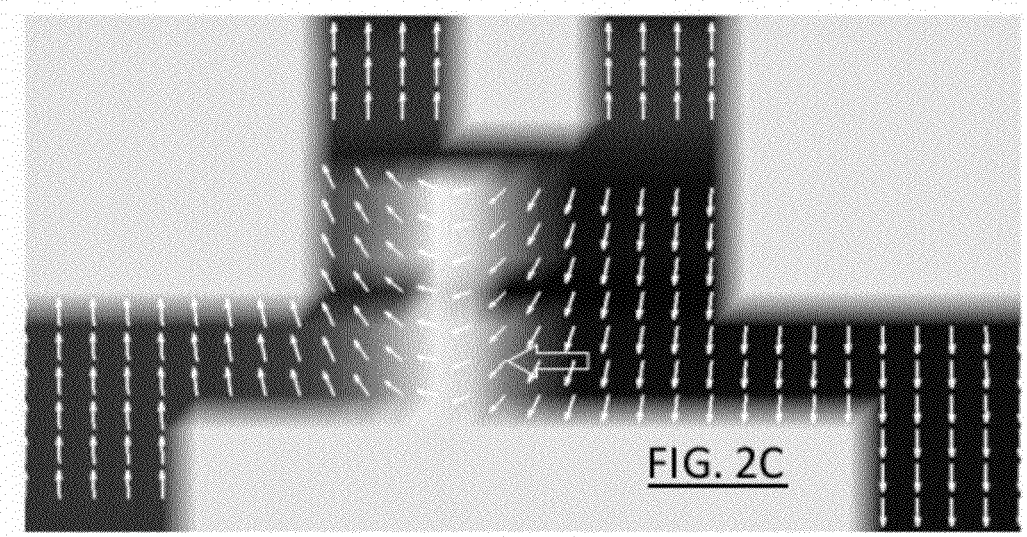
Figure 2D:
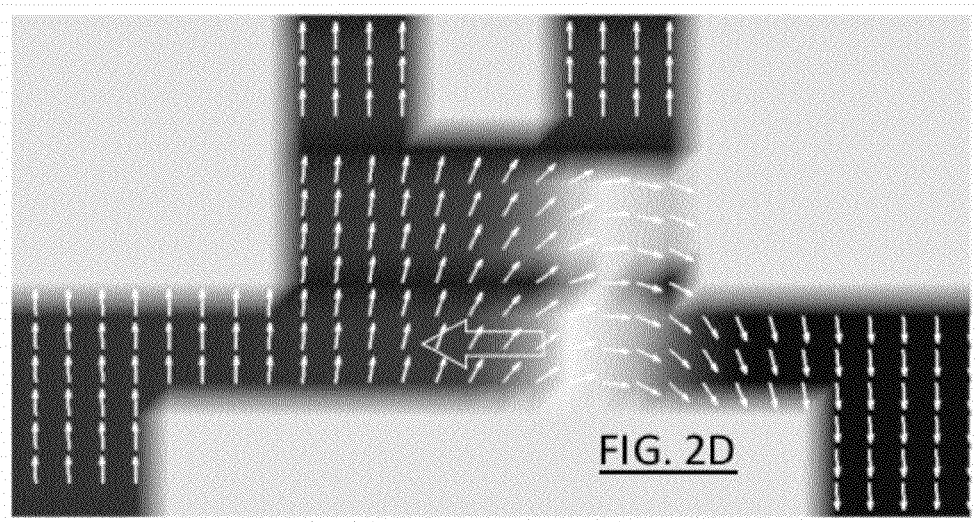
Figure 2E:
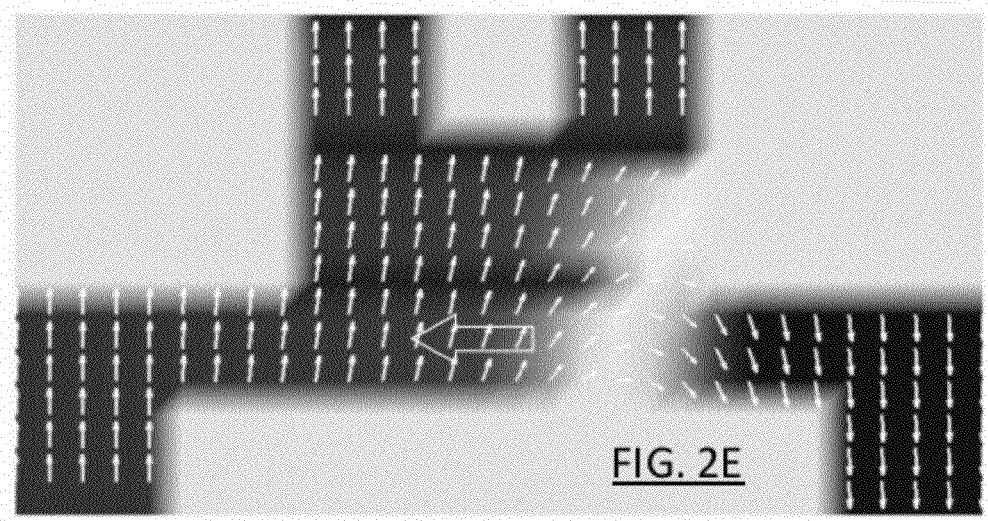
Figure 2F:
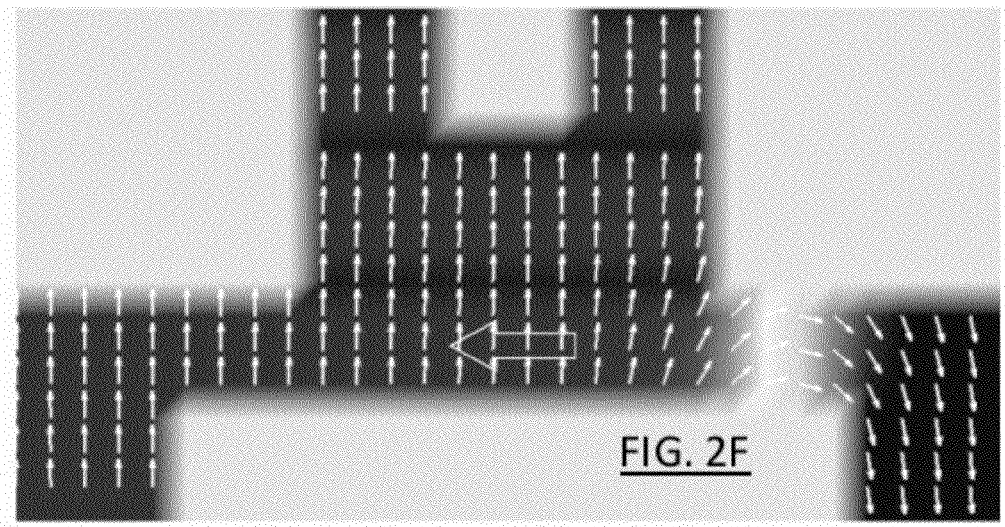
Figure 2G:
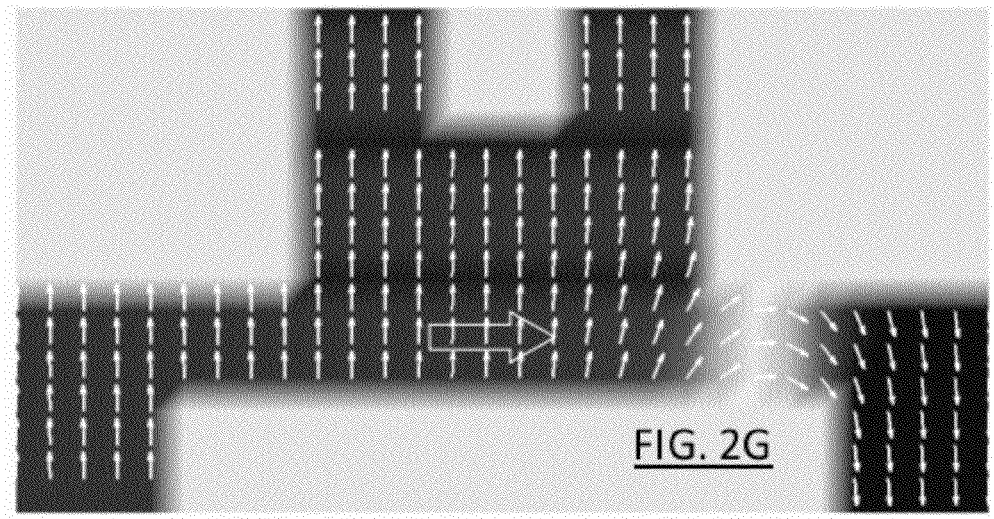
FIGS. 2G-L depict a further micro-magnetic simulation of the exemplary mCell device in which a 1 ns (left-to-right) current pulse across the mCell's domain switching layer causes the domain wall to reposition itself proximate to the left-side pinned region, which causes the device to assume its higher-resistance state.
Figure 2H:
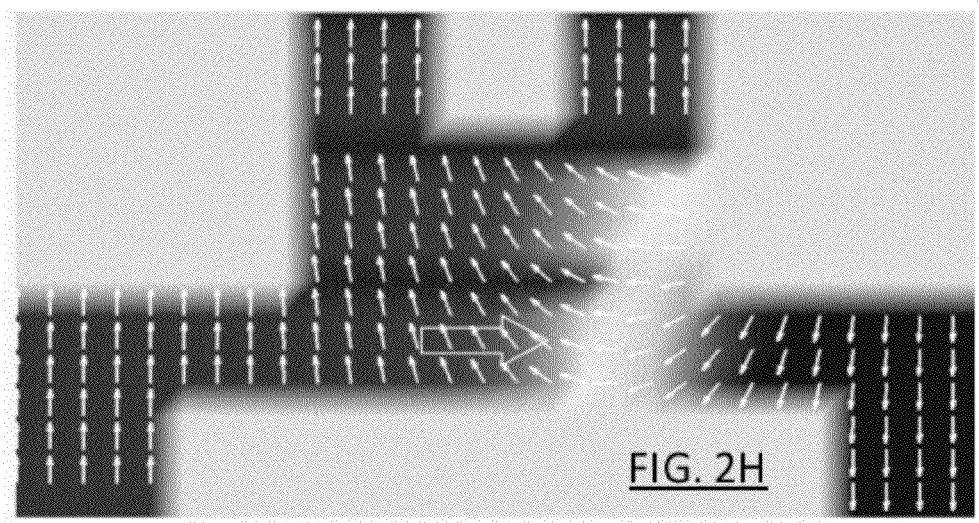
Figure 2I:
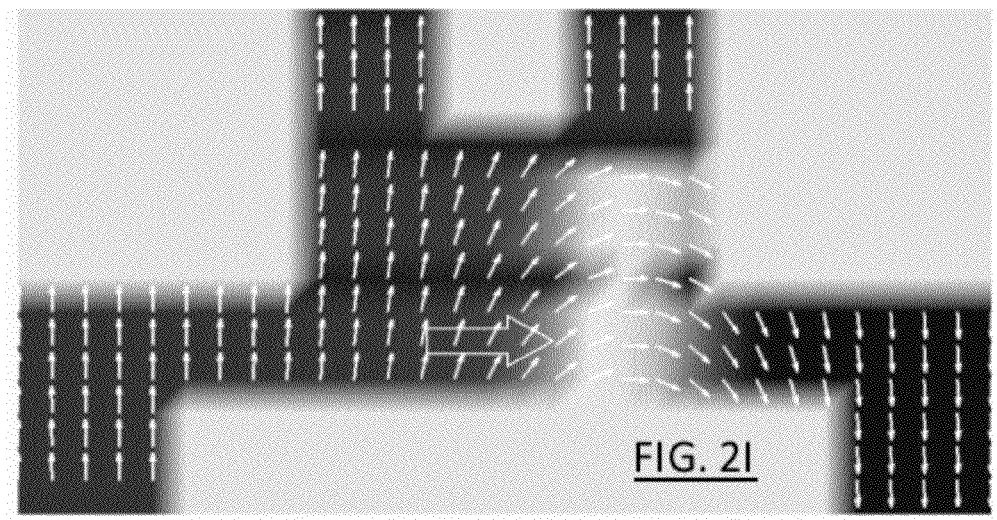
Figure 2J:
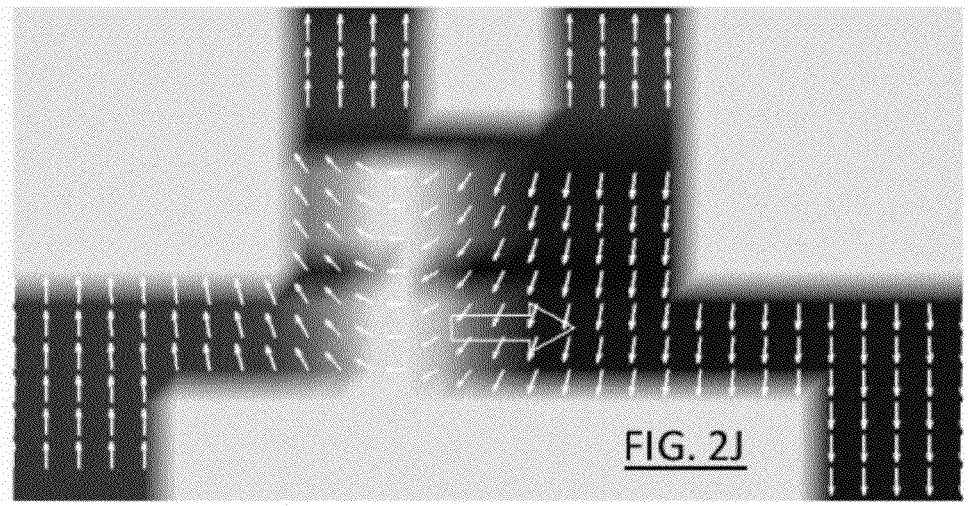
Figure 2K:
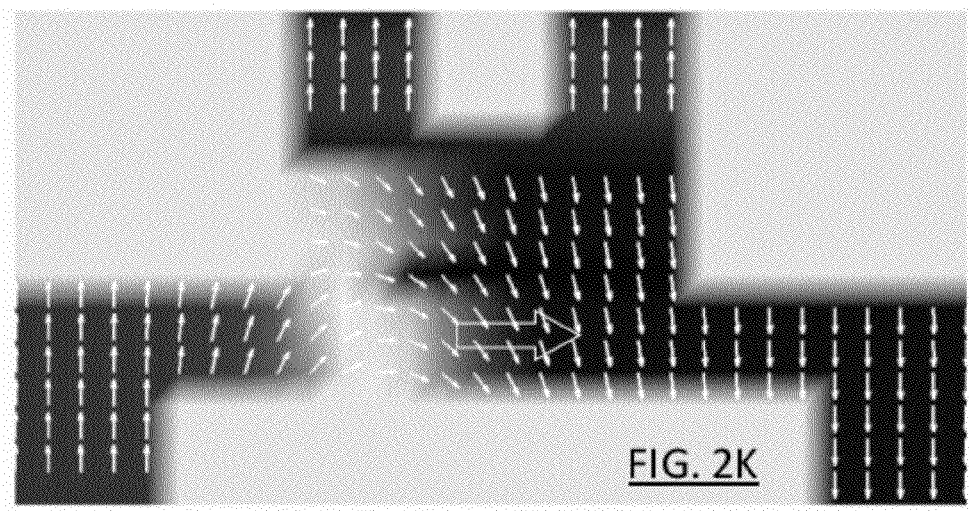
Figure 2L:
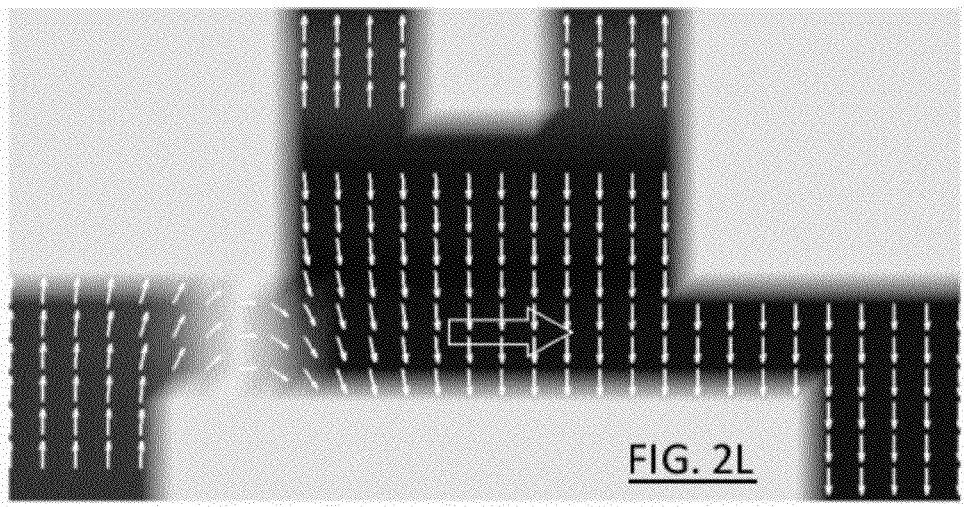

In its lower-resistance state (as depicted in FIG. 1A), the magnetization in the magnetic evaluation layer (5) is substantially aligned with that of the evaluation electrodes (7a-b), which causes the evaluation path to display a lower resistance.

In its higher-resistance state (as depicted in FIG. 1b), the magnetization in the magnetic evaluation layer (5) is substantially perpendicular to that of the evaluation electrodes (7a-b), which causes the evaluation path to display a higher resistance.

Figure 3:
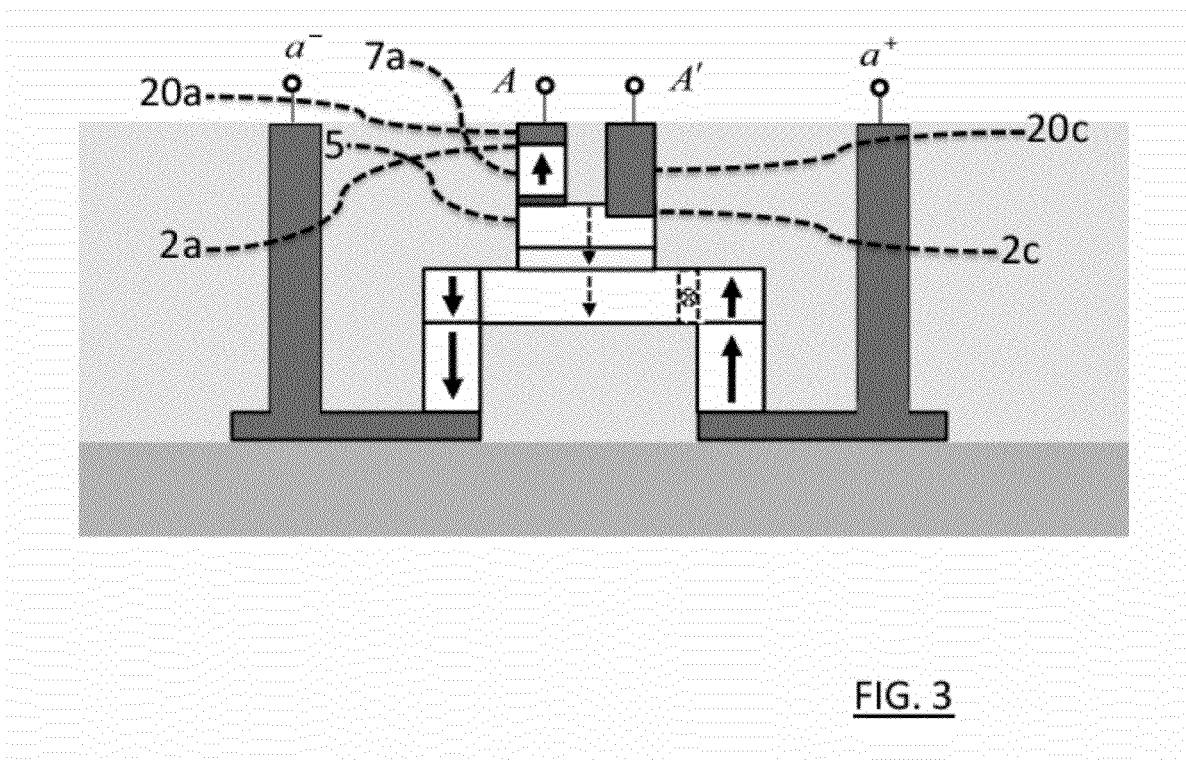
FIG. 3 depicts an illustrative alternative mCell that contains only one tunnel (or other) junction in its evaluation path.

FIG. 3 depicts an alternative mCell in which the evaluation path includes only one tunnel (or other) barrier. In this embodiment, a first contact (20a) provides the first evaluation terminal (2a), and a second, enlarged contact (20c) provides the second evaluation terminal (2c). Consequently, the path between evaluation terminals (2a and 2c) crosses only one tunnel junction between the first evaluation electrode (7a) and the magnetic evaluation layer (5).

Figure 4A:
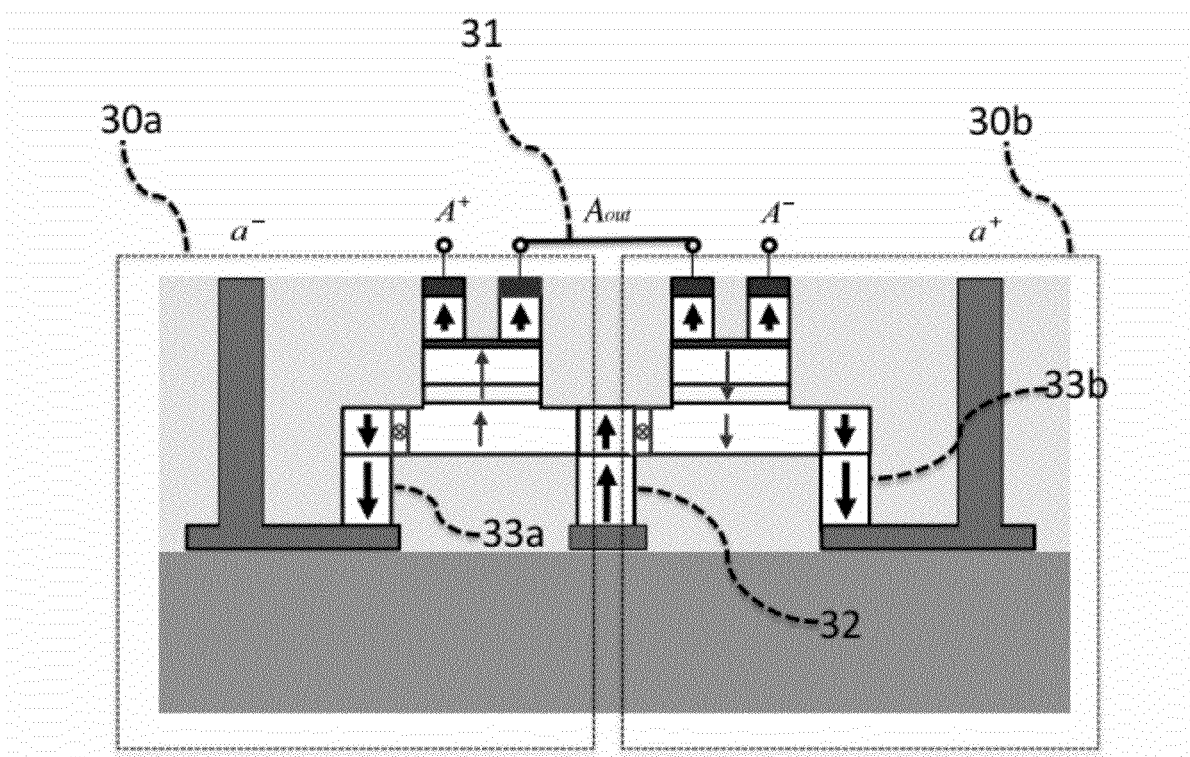
FIGS. 4A-B depict an illustrative complimentary magnetic switching cell inverter (c-mCell-inv) in its high and low output states, respectively.

FIG. 4A depicts an illustrative complimentary mCell inverter (c-mCell-inv) in its high output state. This c-mCell-inv comprises first (30a) and second (30b) mCells that are configured to share a common evaluation terminal (31) [or, alternatively, a common evaluation contact (not illustrated)] and a common programming electrode (32). To create the high output state depicted in FIG. 4A, a current flows from the negative input terminal ($a^-$) to the positive input terminal ($a^+$), which causes the domain wall in the first mCell (30a) to position itself proximate to the first programming electrode (33a) and causes the domain wall in the second mCell (30b) to position itself proximate to the common programming electrode (32). With the domain walls so-positioned, the first mCell's (30a's) evaluation path assumes its lower-resistance state, and the second mCell's (30b's) evaluation path assumes its higher-resistance state. This produces a voltage division that results in the output terminal ($A_{out}$) assuming a value closer to the positive supply ($A^+$) than to the negative supply ($A^-$). [Those skilled in the art will understand that the terms "positive supply" and "negative supply" are used in their relative, rather than absolute, sense. Neither term requires a voltage that is positive or negative relative to an absolute reference (or ground) voltage; rather, they merely require that the "positive supply" provide a higher voltage (e.g., 2V) than the "negative supply" (e.g., 1V), thereby making them positive and negative with respect to an arbitrary intermediate reference point (e.g. 1.5V).]

Figure 4B:
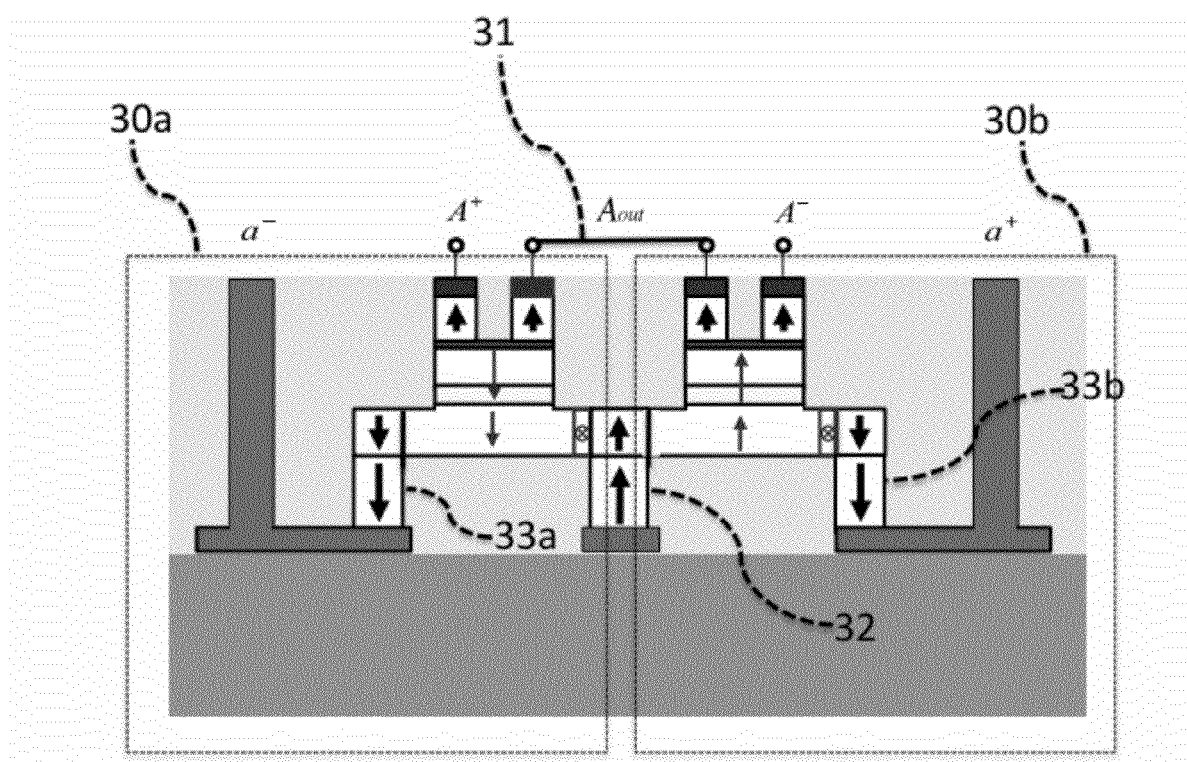
Figures 5A, 5B, 5C, 5D:
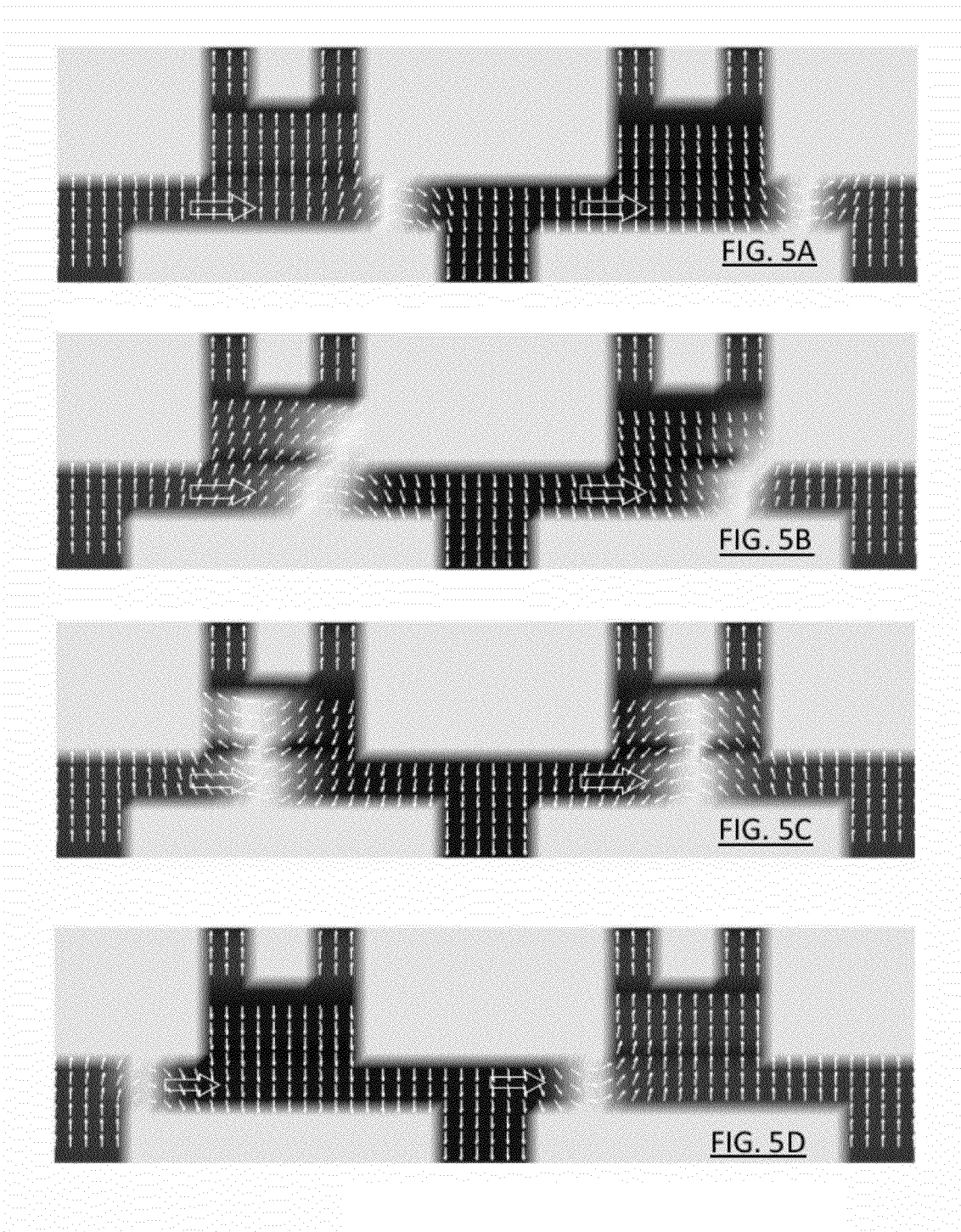
FIGS. 5A-D depict a micro-magnetic simulation of a c-mCell inverter (or buffer) in which a ins (left-to-right) current pulse causes domain walls in the respective left and right mCells to relocate to the left side of their respective cells, thus causing the left mCell to assume its higher-resistance state and the right mCell to assume its lower-resistance state.
Figure 5I:
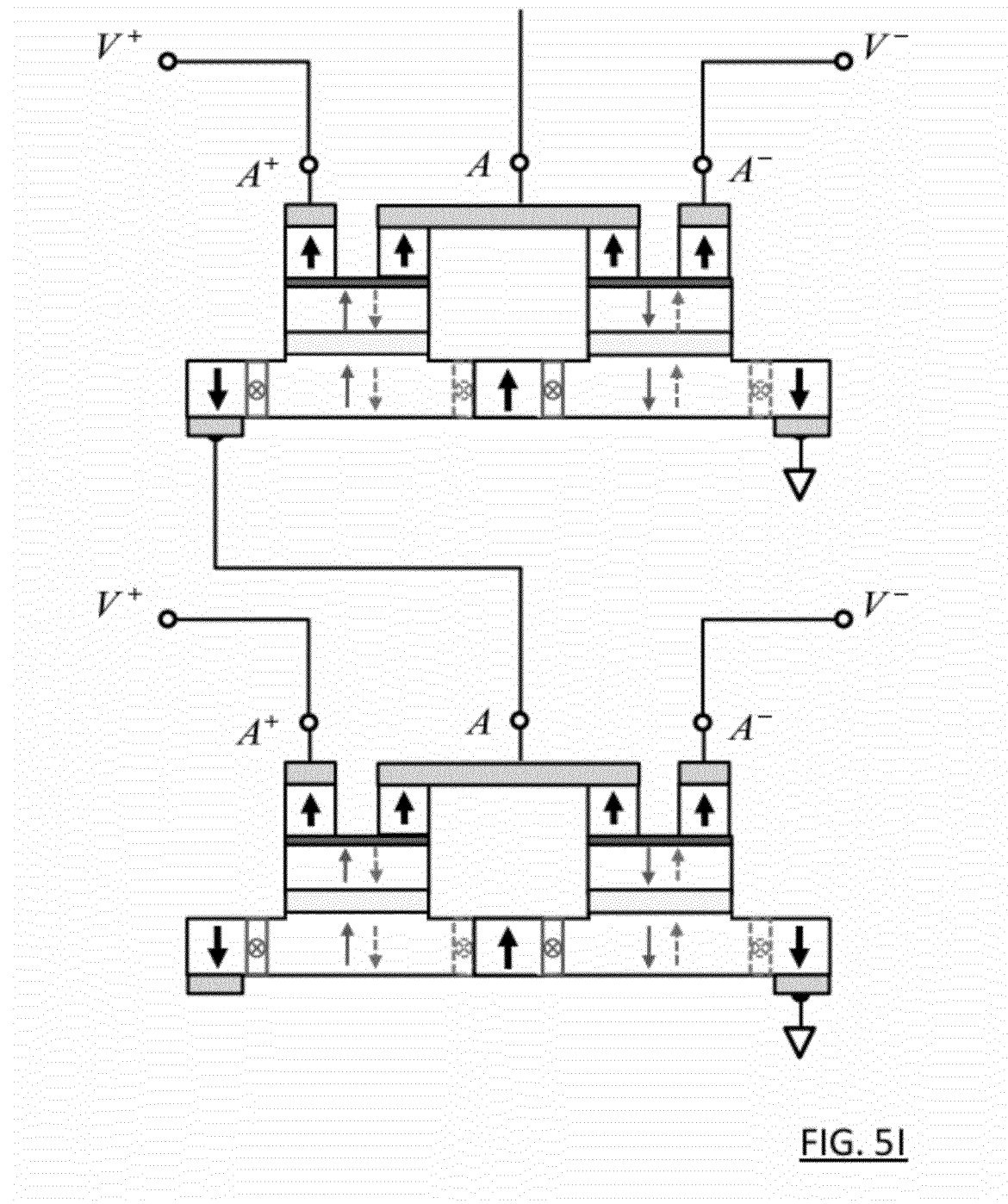
FIG. 5I illustrates two successively connected c-mCells.

The low output state of the c-mCell-inv is depicted in FIG. 4B. To produce this state, a current flows from the positive input terminal ($a^+$) to the negative input terminal ($a^-$), which causes the domain wall in the first mCell (30a) to position itself proximate to the common programming electrode (32) and causes the domain wall in the second mCell (30b) to position itself proximate to the second programming electrode (33a). With the domain walls so-positioned, the first mCell's (30a's) evaluation path assumes its higher-resistance state, and the second mCell's (30b's) evaluation path assumes its lower-resistance state. This produces a voltage division that results in the output terminal ($A_{out}$) assuming a value closer to the negative supply ($A^-$) than to the positive supply ($A^+$).

The same structure depicted in FIGS. 4A-B can be configured as a complimentary mCell buffer (c-mCell-buf) by reversing the polarity of the positive ($a^+$) and negative ($a^-$) input terminals, or by reversing the polarity of positive ($A^+$) and negative ($A^-$) supply terminals. Thus, from a structural point of view, the c-mCell-inv and c-mCell-buf are identical, and either can be referred to simply as a c-mCell.

FIGS. 5A-D contain snapshots from a micro-magnetic simulation of a c-mCell inverter/buffer in which a 1 ns (left-to-right, as depicted by the block arrows) current pulse causes domain walls (the light regions with substantially horizontal field lines) in the respective left and right mCells to relocate to the left side of their respective cells, thus causing the left mCell to assume its higher-resistance state and the right mCell to assume its lower-resistance state. FIGS. 5A, 5B, 5C and 5D represent the state of the c-mCell at t=0 ns, t=0.55 ns, t=0.67 ns and t=0.82 ns, respectively.

FIGS. 5E-H contain snapshots from a further micro-magnetic simulation of the c-mCell inverter/buffer in which a ins (right-to-left) current pulse causes domain walls in the respective left and right mCells to relocate to the right side of their respective cells, thus causing the left mCell to assume its lower-resistance state and the right mCell to assume its higher-resistance state. FIGS. 5E, 5F, 5G and 5H represent the state of the c-mCell at t=0 ns, t=0.52 ns, t=0.70 ns and t=0.90 ns, respectively.

Figure 6:
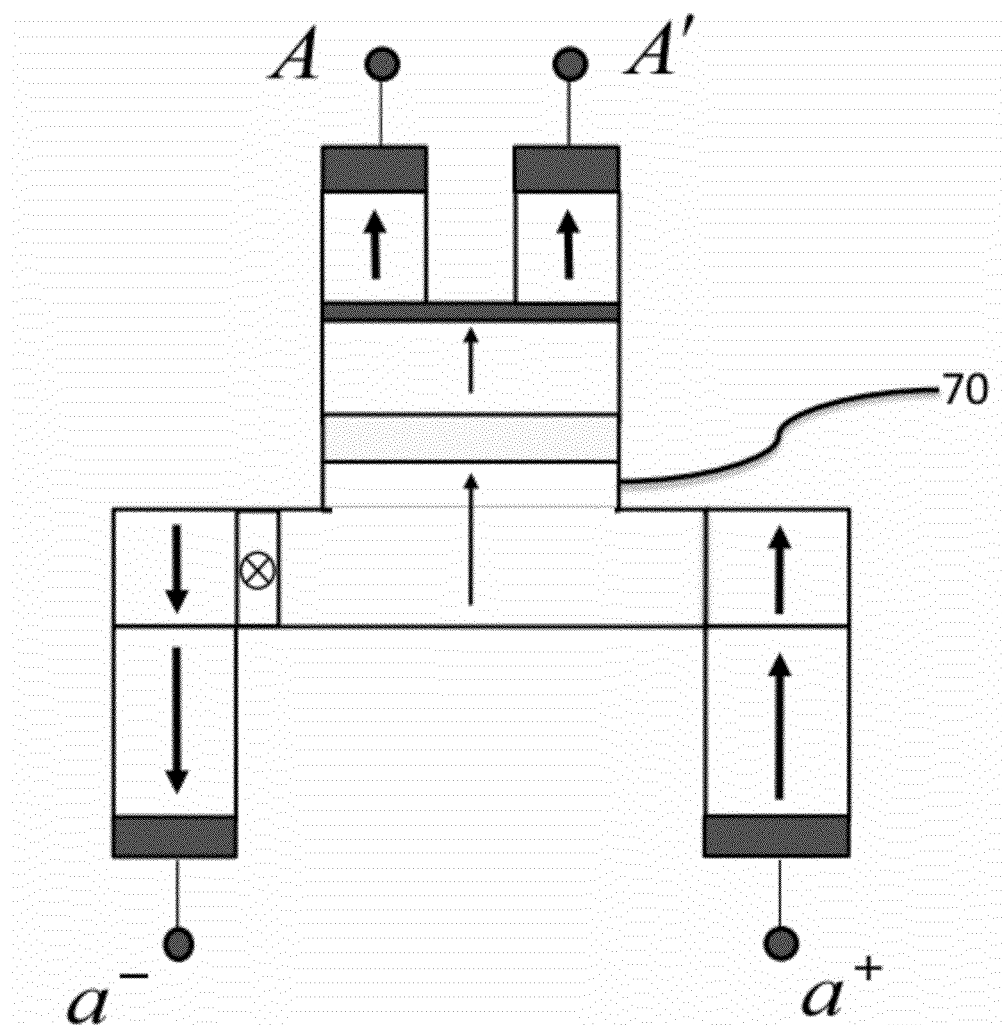
FIG. 6 illustratively depicts an alternative embodiment of an mCell, in which the magnetic coupling between the domain switching region and evaluation region operates via magnetic field switching through an intervening non-magnetic layer.
Figure 7A:
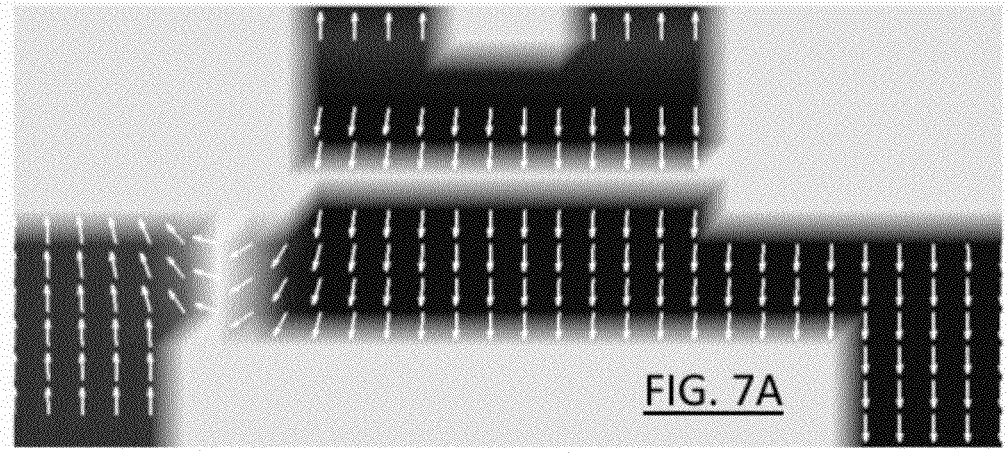
FIGS. 7A-F depict a micro-magnetic simulation of a state change for the FIG. 6 device.
Figure 7B:
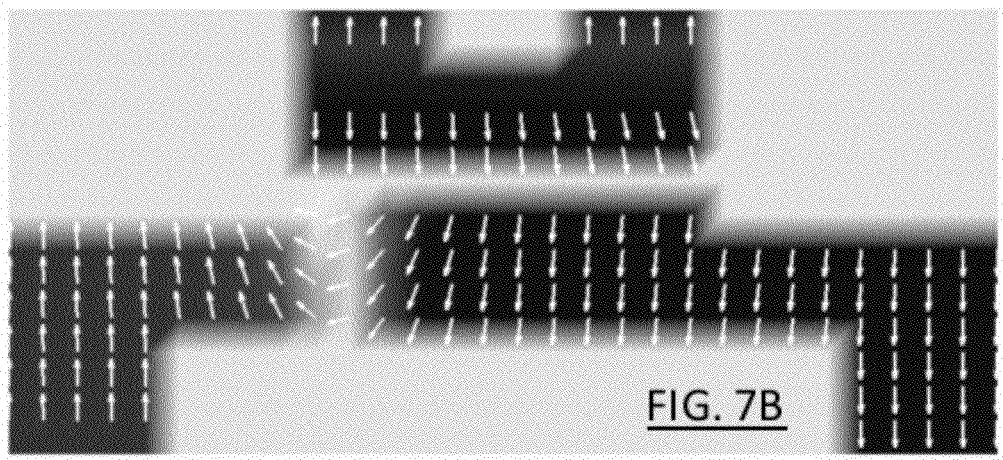
Figure 7C:
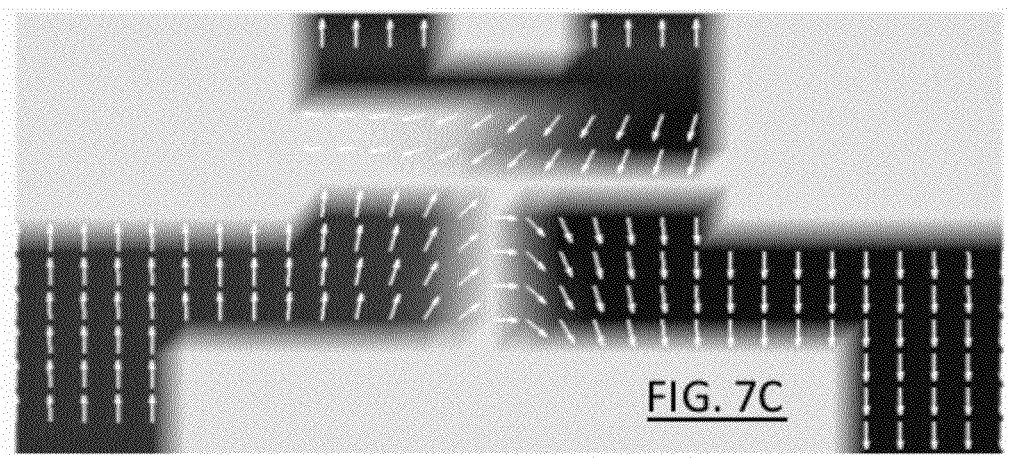
Figure 7D:
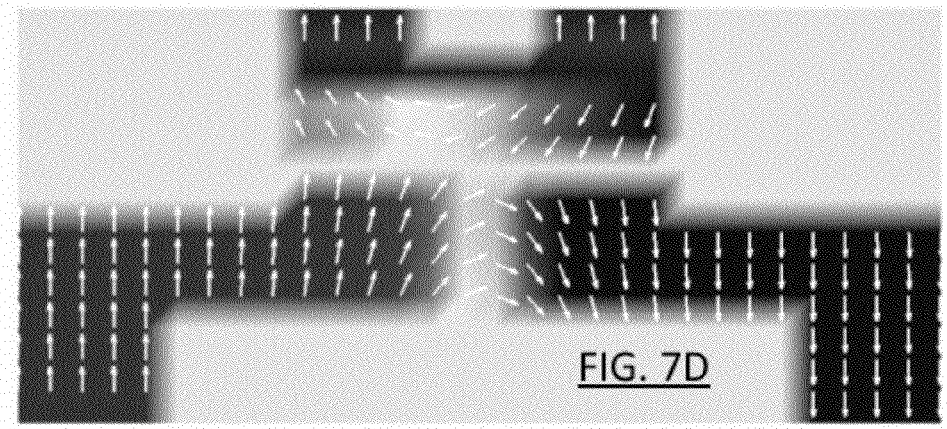
Figure 7E:
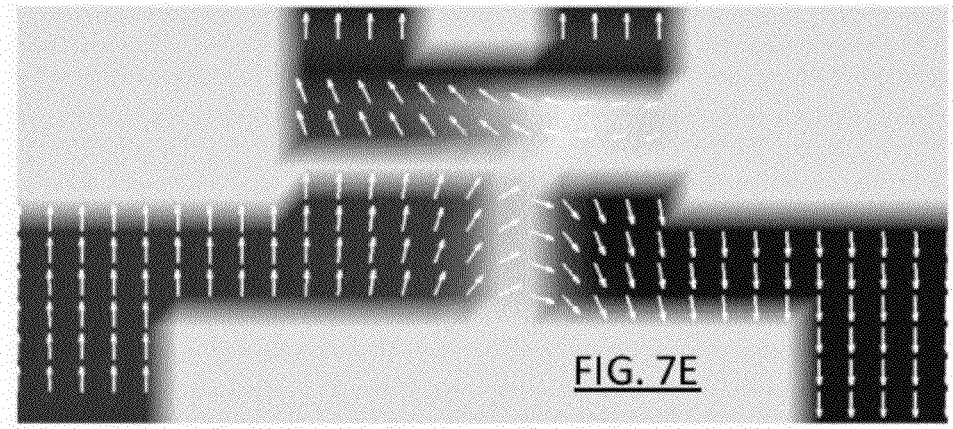
Figure 7F:
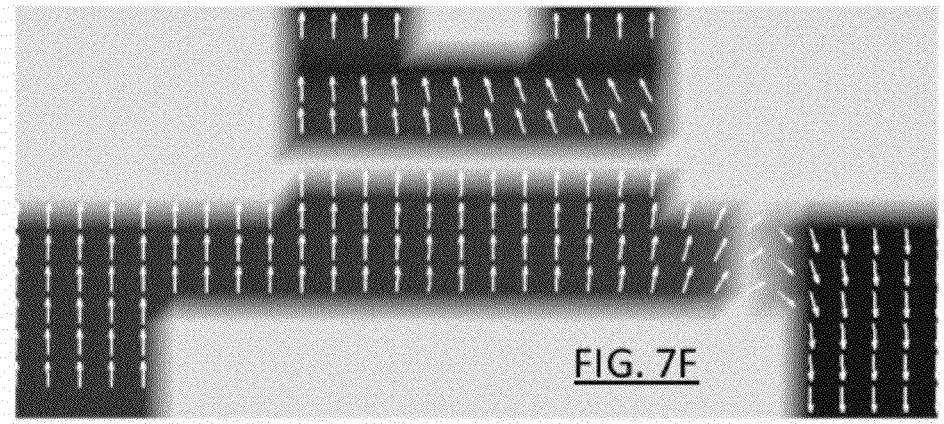
Figure 7G:
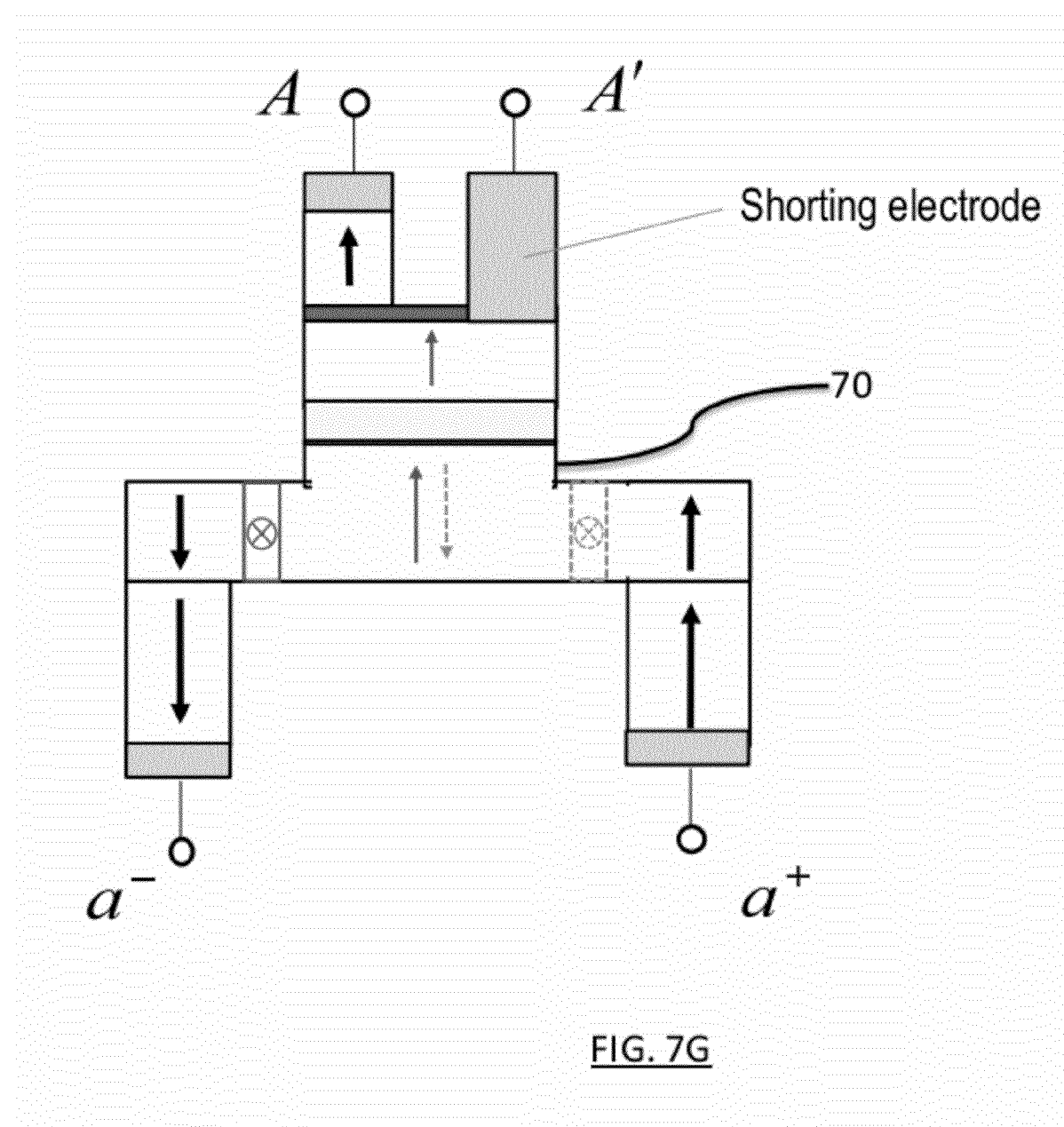
FIG. 7G depicts a modification of the FIG. 6 device that replaces one of the tunnel junctions in the evaluation path with a shorting ohmic contact.
Figure 7H:
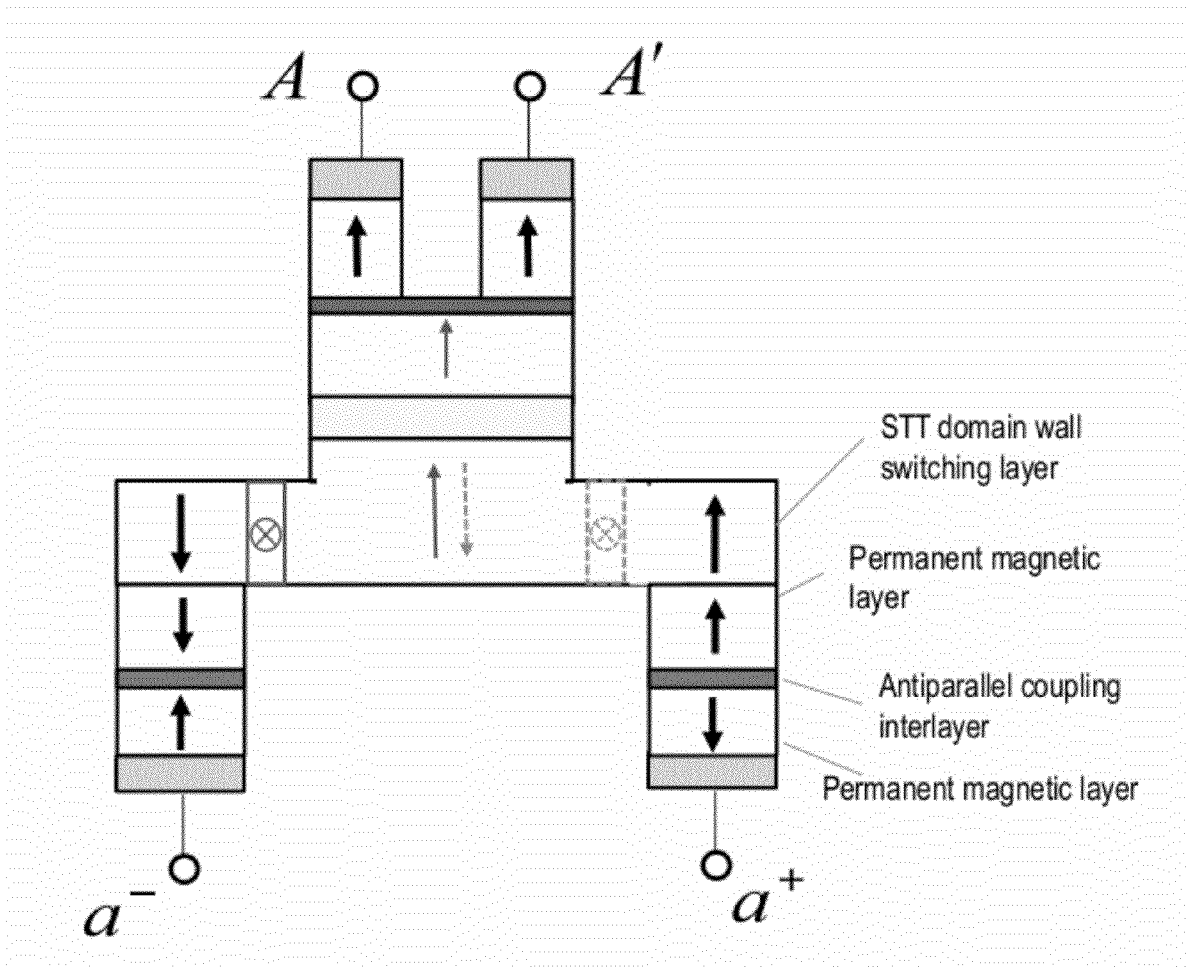
FIG. 7H depicts an alternative mCell embodiment in which the permanently magnetized bottom studs consist of a synthetic antiferromagnet (SAF) structure comprised of opposing magnetic layers linked by an antiparallel coupling interlayer.

FIGS. 6 and 7G specifically call out a step 70 in the domain wall switching layer that is significant design feature and generally applicable to all of the embodiments herein. This step can be created by etching into the domain wall switching layer to a controlled depth. It can be precisely formed by inserting a magnetic etch-stop layer in the domain wall switching layer.

The purpose of step 70 is to discourage the domain wall from remaining in the intermediate region below the lower electrode of the MTJ, which ensures more complete magnetization reversal. In this way, the two domain wall locations, one at the left side and the other at the right side as indicated in the figures, are the two stable positions with an energy barrier in between the two stable states. The height of the energy barrier is determined by the physical height of the step 70, the anisotropy energy constant, and the exchange stiffness constant of the domain wall switching layer.

Figure 7I:
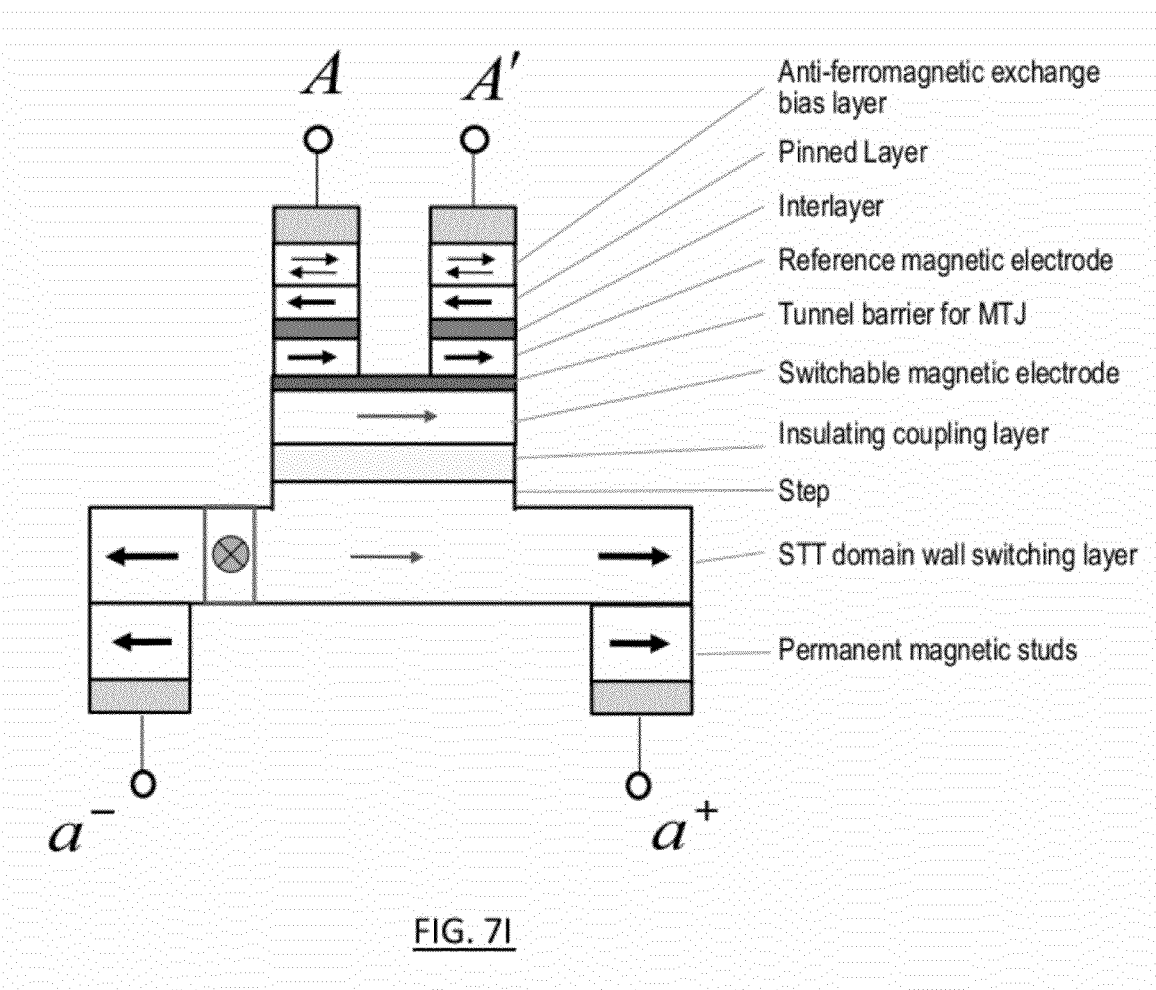
FIG. 7I depicts an alternative mCell embodiment that utilizes in-plane magnetizations in both the domain switching and evaluation layers.
Figure 7J:
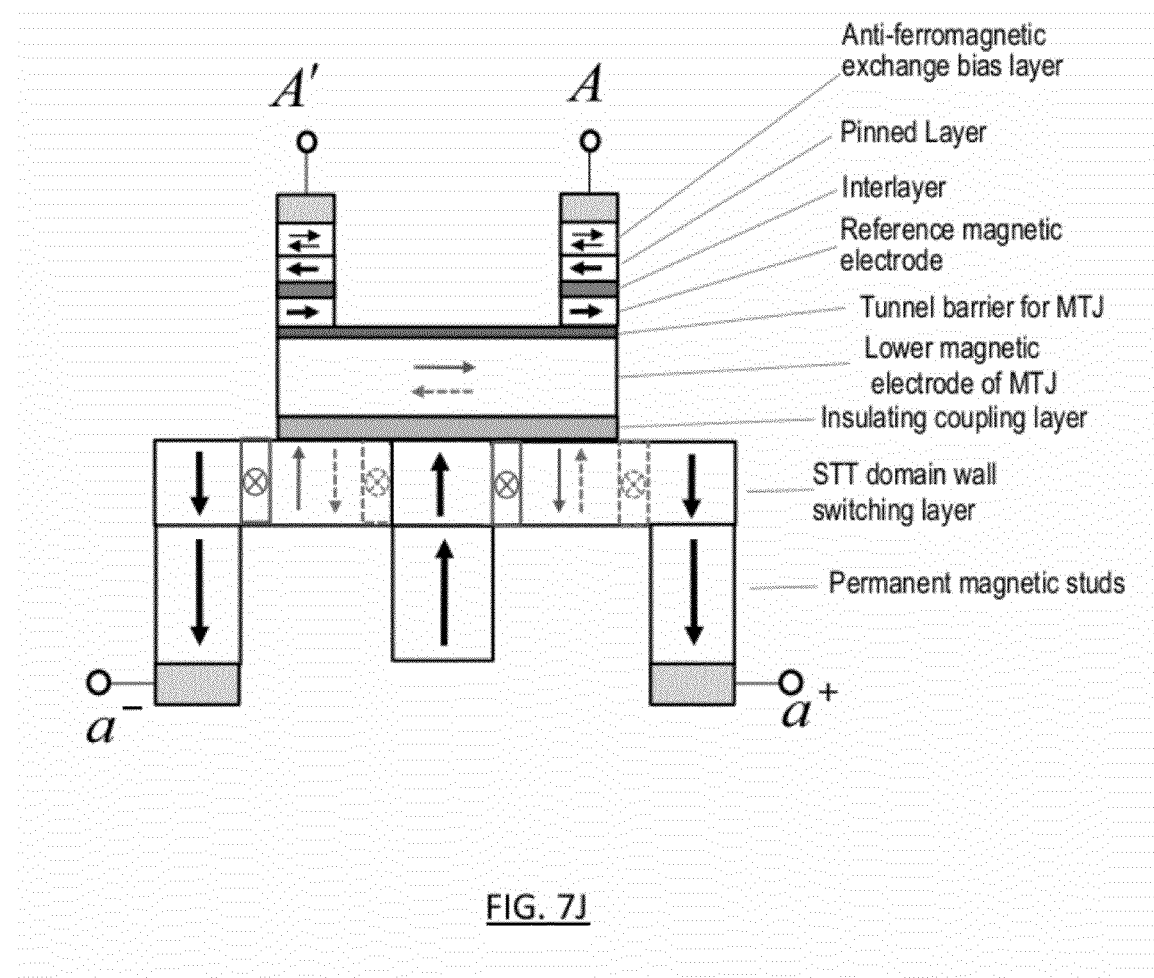
FIG. 7J depicts an alternative mCell embodiment that utilizes in-plane magnetizations in the evaluation layer and perpendicular magnetizations in the domain switching layer.
Figure 7K:
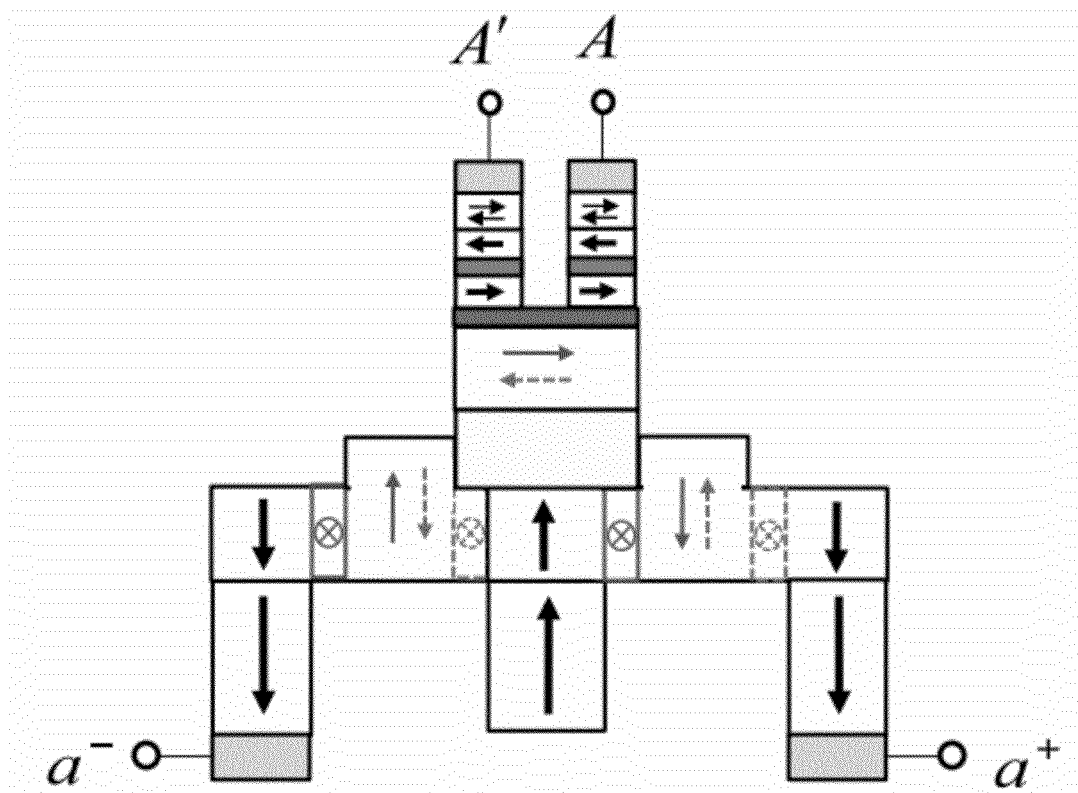
FIG. 7K presents an alternative embodiment of the mixed in-plane/perpendicular mCell introduced in FIG. 7J.

FIGS. 7I, 7J and 7K show alternative designs of an mCell. In all of these designs, the magnetic electrodes of the MTJ have in-plane magnetization, i.e. the magnetization lies in the film plane in quiescent state. The top magnetic electrode of the MTJ is formed by a multilayer structure: the reference layer becomes a part of a synthetic antiferromagnetic (SAF) that has an additional magnetic layer (pinned layer) antiparallely exchange coupled with the reference layer to shunt the stray field of the reference layer away from the lower magnetic electrode of the MTJ. An antiferromagnetic layer is placed on top of the pinned layer to provide an exchange bias field, which pins the magnetization of the pinned layer.

In the design shown in FIG. 7I, the magnetizations of the domain switching layer as well as the bottom pinning magnetic studs are all in-plane.

In the designs shown in FIGS. 7J and 7K, the bottom magnetic pinning studs and the domain switching layer all have perpendicular magnetization. The domain wall switching layer is divided into two segments by a middle, permanently magnetized stud whose magnetization orientation is opposite to that of the two other studs at the two ends of the domain wall switching layer. The insulating coupling layer acts as a magnetization flux conductor such that the lower magnetic electrode of the MTJ conducts the magnetization flux from the left segment of the domain wall switching layer to the right segment of the domain wall switching layer. Thus, the domain wall displacement resulting from the current flow in the domain wall switching layer can yield a magnetization switching of the lower magnetic electrode of the MTJ.

In accordance with certain aspects/embodiments of the invention, logic gates, circuits and systems can be constructed using a perpendicular MRAM device. These embodiments are discussed at Appendix A (pages 2-9) of the incorporated '743 application.

The preferred embodiments of the invention utilize mCell devices with isolation between the programming and evaluation paths, as described in exemplary detail below.

Figure 8:
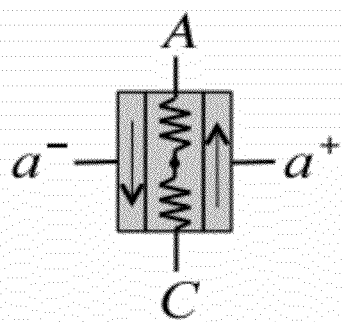
FIG. 8 depicts a schematic symbol used to represent the mCells of the type illustrated in FIGS. 1A, 1B, 3, 6, 7G, 7H, 7I, 7J, 7K, and/or 15I.

FIG. 8 shows a new schematic symbol for the inventive mCells. As depicted, it is a four-terminal device. The programming path extends between the first ($a^-$) and second ($a^+$) programming terminals, and the evaluation path extends between the first (A) and second (C) evaluation terminals. As previously described, a current pulse that flows from the first ($a^-$) to the second ($a^+$) programming terminal will cause a domain wall repositioning that produces the lower-resistance state, as measured between evaluation terminals (A-C). Conceptually, this is illustrated by the down-arrow in the schematic symbol—i.e., currents flowing "into" the down-arrow ($a^-$) terminal cause the evaluation path (A-C) resistance to go "down," following the electron flow and fixed magnetic material polarity convention established in FIG. 1. Similarly, currents flowing into the up-arrow ($a^+$) terminal cause the evaluation path (A-C) resistance to go "up."

A point worth noting, here, is that mCells are fundamentally current-responsive devices with memory. So, while the output state (e.g., the A-C resistance) is "responsive" to logic signals (e.g., currents) that flow between the programming terminals, the response is both immediate (e.g., the domain wall switches in about a 1 ns) and long-term. However, depending upon the circuit configuration, the resulting resistance change might not have any effect until some clock, switch or other device enables current flow through the device's evaluation path. In the preferred embodiments that use two-phase clocking in which mCells program on one phase and evaluate on another, the "response" of a particular mCell to an input signal will not be "seen" by the rest of the circuit until the next clock phase—by which point the input signal is no longer being applied. Accordingly, the terms "in response," "responsive" and the like should be read to cover immediate response, delayed (e.g., next clock phase) response or both, depending upon the context.

Figure 9A:
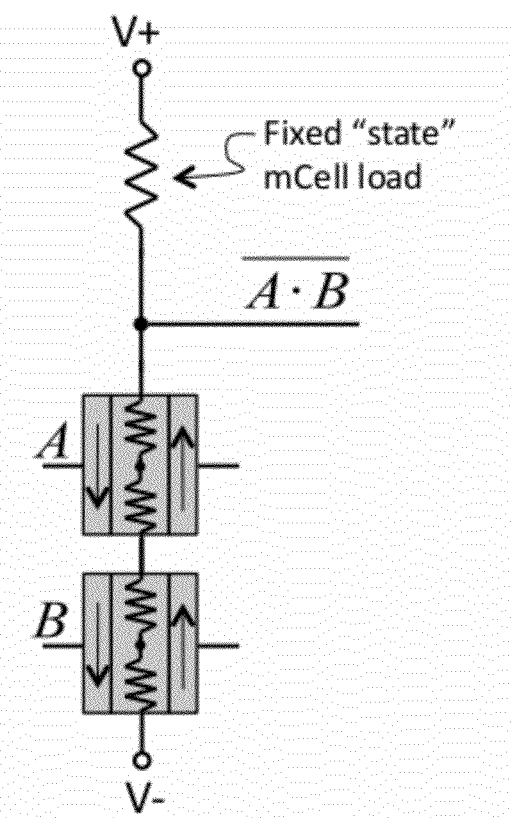
FIG. 9A depicts an illustrative mCell-based NAND2 gate in a single-ended, passive-load implementation.

FIG. 9A shows an exemplary magnetic logic circuit (a NAND2 gate) in a single-ended (non-differential), passive-load (non-complimentary) configuration. The depicted inverter contains plural mCells. The upper mCell (that receiving the A input) is configured as a logic-driving cell with one of its evaluation terminals coupled indirectly to the negative supply terminal (V−) and the other of its evaluation terminals connected to the gate's output node (the NOT(A AND B) output), which can be connected to drive the programming terminals of multiple fanout-receiving mCells (not depicted). When the logic-driving cell is in its lower-resistance state, current(s) coupled from the supply terminal through the evaluation path of the logic-driving cell and through the programming paths of the fanout-receiving cells set the resistance states of the fanout-receiving cells. Because the mCells have very low resistance through their programming paths and because the programming operation is inherently current-based, the preferred fanout scheme is to serially connect one fanout cell to the next, such that driving currents pass sequentially through each fanout cell; however, although not preferred, the invention can also accommodate parallel fanout connections, similar to those used with traditional logic families. [Additional examples of magnetic logic circuits in the single-ended, non-complimentary form are show in Appendix A, FIG. 7 of the '743 application.]

In order to fully appreciate the content of FIG. 9A (and the other circuit drawings), one should understand certain drawing conventions. First, the positive and negative supplies (shown as V+ and V−) need not be any particular voltage. Moreover, these supplies need not be continuous. Indeed, at least one (and preferably both) are pulsed, and the system as a whole is operated on a two-phase clocking scheme, as is elsewhere discussed.

Second, the programming inputs of the mCells that are depicted as "unconnected" are not, in fact, left floating, but rather connected to some reference point. The reference point could be an intermediate voltage somewhere between the positive and negative supplies, or it could be one of the supplies, and the reference point need not be continuous—as its value only matters when the mCells are sourcing or sinking a current. [In the case of differential design, a gate might be depicted as receiving a single logic input, but it would be naturally understood by those skilled in the art that such a gate would receive the other end of the differential signal on its "unconnected" input.]

Third, what is shown as a "passive" load resistor could be—and preferably is, for matching purposes—a fixed-state mCell.

Figure 9B:
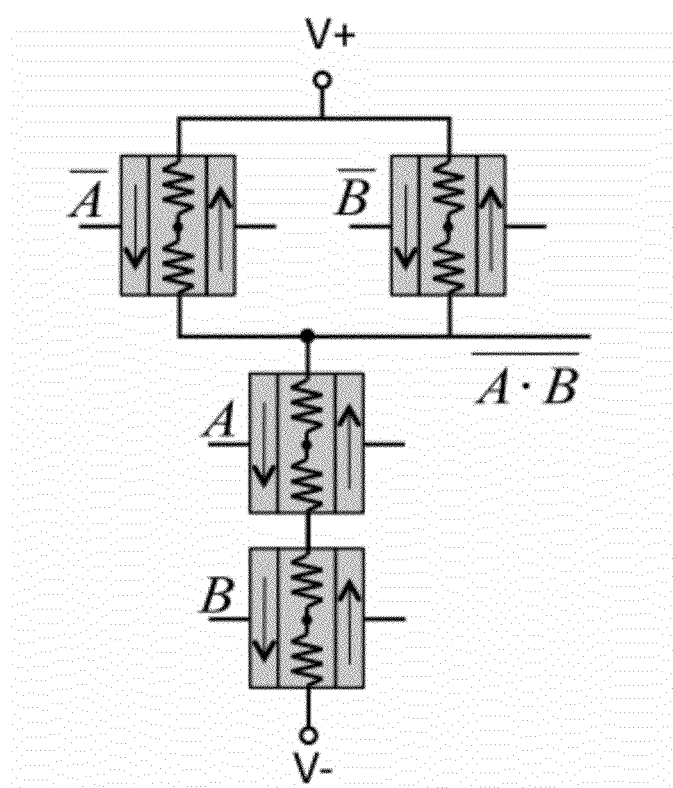
FIG. 9B depicts an illustrative mCell-based NAND2 gate in an alternative, single-ended, complementary implementation.

FIG. 9B shows the same logic function as FIG. 9A (a NAND2 gate), but this time implemented in a single-ended (non-differential), active-load (complimentary) mCell configuration. FIG. 9B is essentially self-explanatory. However, one drawing convention is worth noting.

In FIG. 9B, the upper-stack mCells are shown as receiving the logically inverted inputs (not-A and not-B, respectively), which persons skilled in the art would immediately recognize as potentially complicating—because such inverted literals are not always available. The invention, however, provides this for free, because rather than connecting the not-A/not-B literals to the respective first programming terminals of the upper-stack mCells (as FIG. 9B literally shows), the non-inverted A/B literals can be instead connected to the respective second programming terminals of the upper-stack mCells to achieve the identical logical result. While FIG. 9B is intended to covey both possible implementations, it will be understood that the second implementation (using the non-inverted literals) would typically be preferred, except for example in a case where the inverted literal was already available in the immediate proximity of the relevant input terminal.

Figure 10:
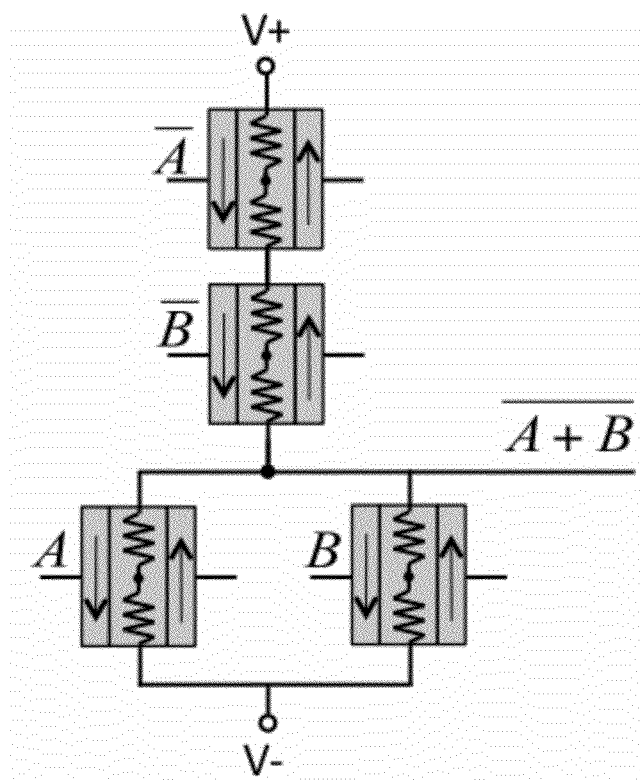
FIG. 10 depicts an illustrative mCell-based NOR2 gate in a single-ended, complementary implementation.

FIG. 10 shows an exemplary mCell implementation of a NOR2 logic gate in the single-ended, complimentary style. Here, too, while the upper-stack mCells of this NOR2 gate are literally depicted as receiving the inverted literals at their respective first programming terminals, the drawing is intended to also convey a preferred implementation in which the upper-stack mCells receive the non-inverted literals at their respective second programming terminals.

Figure 11:
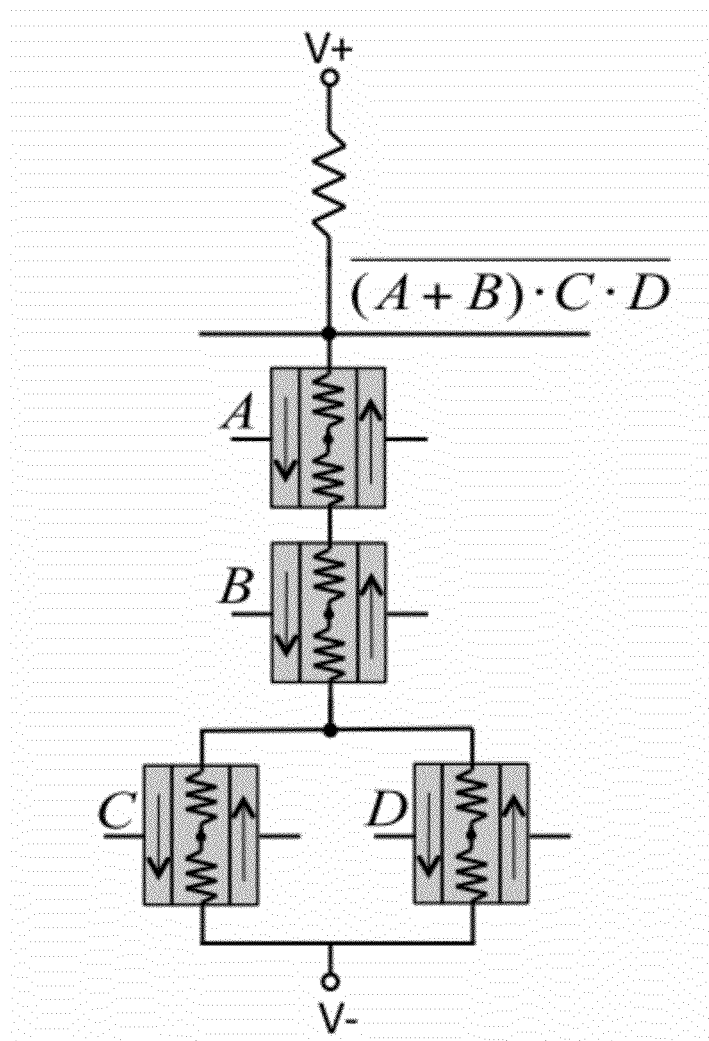
FIG. 11 depicts an illustrative mCell-based implementation of a complex (OAI) logic function in a single-ended, passive-load form.

FIG. 11 depicts a single-ended, passive-load mCell implementation of a complex (OR-AND-INVERT) logic function. As with FIG. 9A, even though the load is illustratively depicted as a resistor, FIG. 11 is intended to convey a preferred implementation in which the load element would be realized as a properly ratioed mCell with its inputs fixed.

Figure 12A:
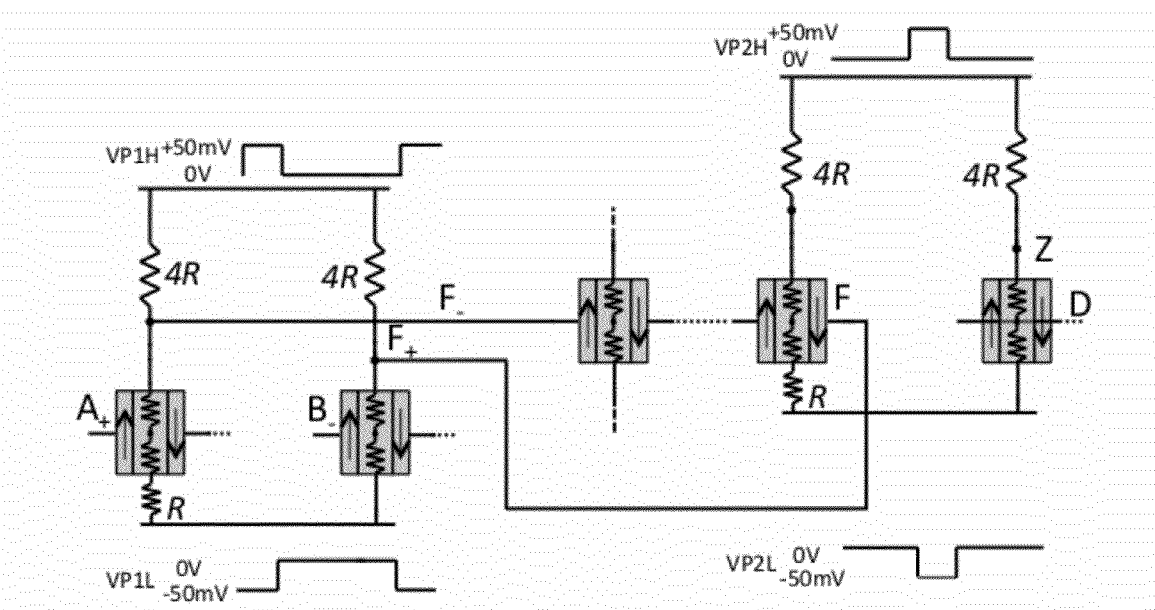
FIG. 12A illustrates a differential, mCell-based, passive-load implementation of the logic circuit (portion) schematically depicted in FIG. 12B.
Figure 12B:
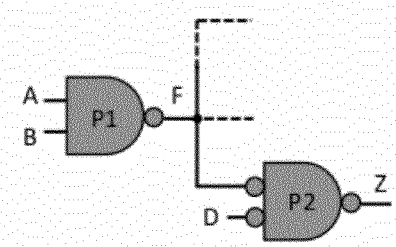

FIGS. 12A-B illustratively depict the logic fanout for portion of a differential, passive-load mCell implementation. As depicted in FIG. 12A, each gate operates on a different clock phase with its own pulsed positive and negative supplies. This two-phase operation is annotated in the logic diagram of FIG. 12B by the "P1" and "P2" designations, which indicate whether the gate activates its evaluation path on the first or second phase.

Figure 13A:
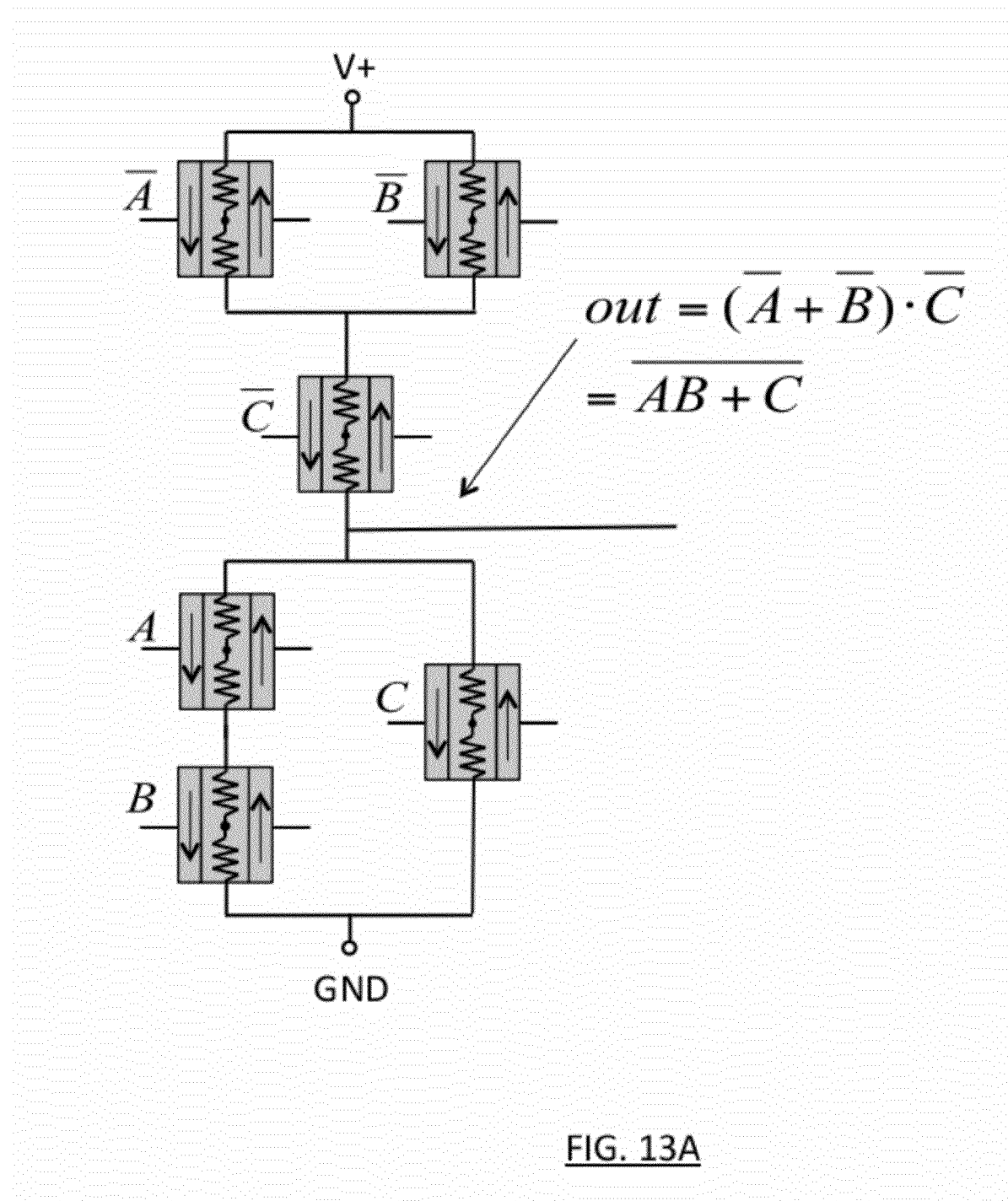
FIG. 13A depicts another illustrative mCell-based implementation of a complex (AOI) logic function in a single-ended, complimentary form.

FIG. 13A depicts another illustrative mCell-based implementation of a complex (AOI) logic function in the single-ended, complimentary form. As with the previous figures, FIG. 13A is intended to convey a preferred implementation in which the upper-stack mCells receive non-inverted literals at their respective second programming inputs.

Figure 13B:
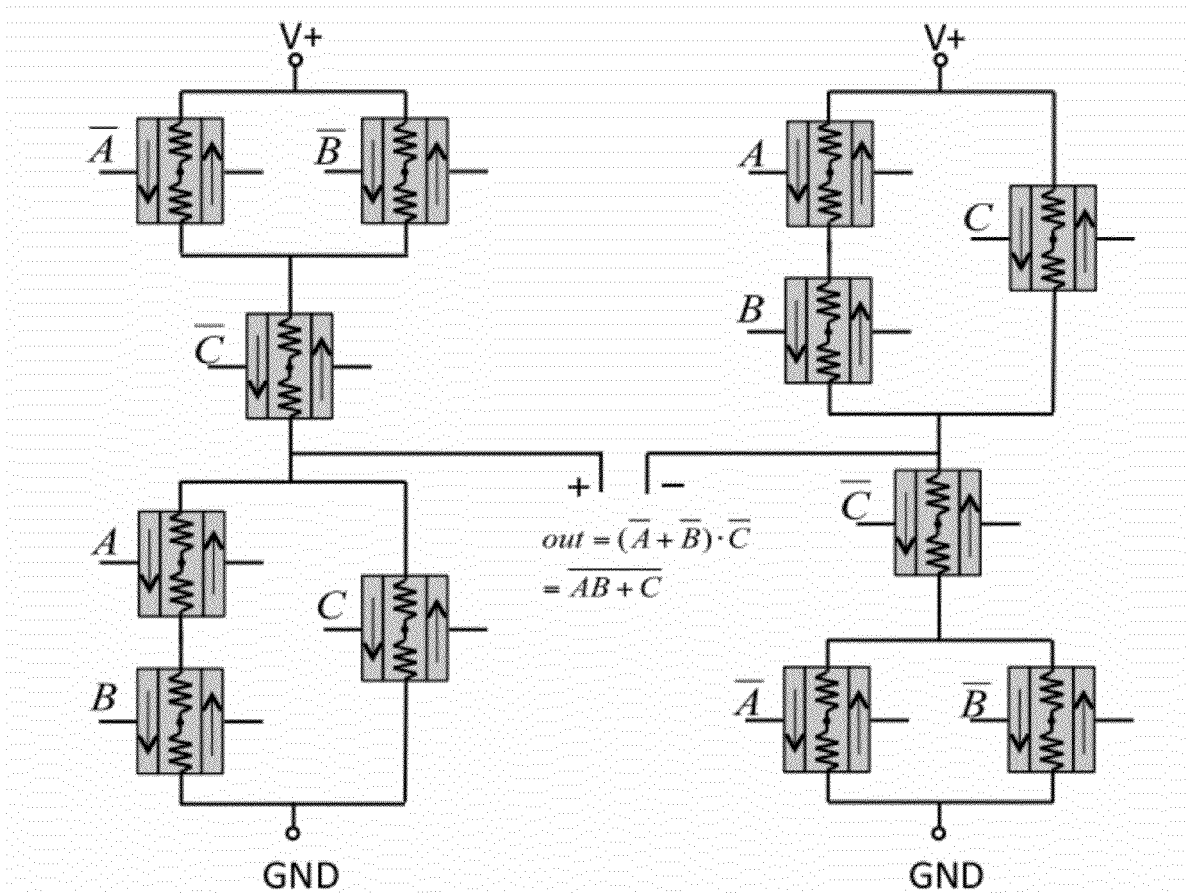
FIG. 13B depicts an alternative mCell-based implementation of the complex logic function of FIG. 13A, using a differential, complimentary form.

FIG. 13B depicts an alternative mCell-based implementation of the AOI function of FIG. 13A, but this time using a differential, complimentary form. In FIG. 13B, as with all the differential designs, each mCell receives dual (differential) inputs. So when the drawing shows a given mCell (those in the upper stack, for example) as receiving an inverted literal, this is intended to convey that the input-to-programming-terminal connections on that mCell are flipped relative to the connections on the mCell that received the non-inverted literal.

Figure 14A:
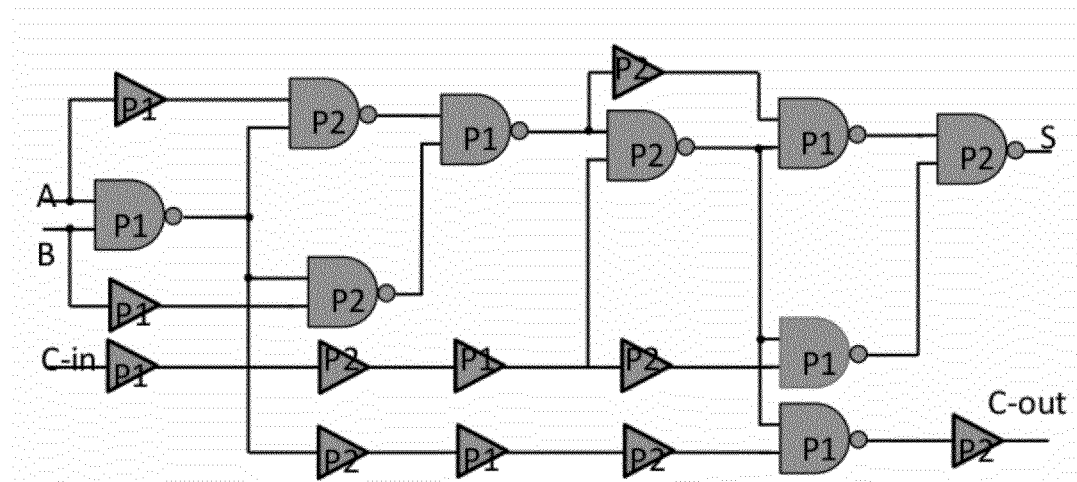
FIG. 14A depicts an illustrative two-phase, mCell-based implementation of a half adder circuit.
Figure 14B:
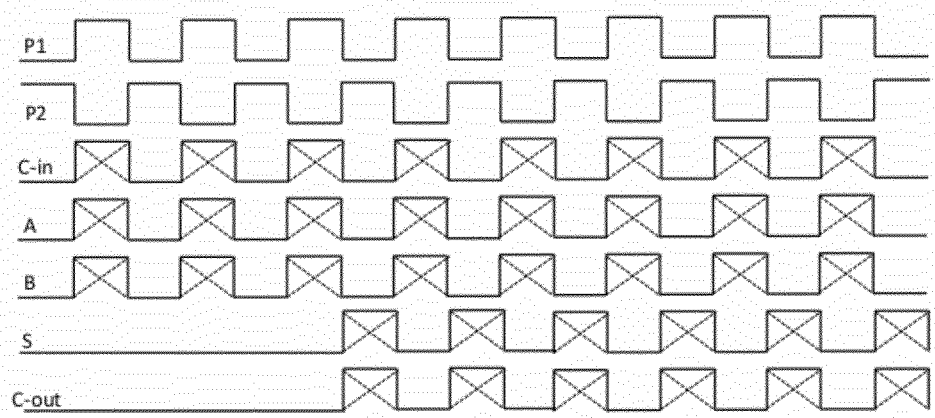
FIG. 14B contains a timing diagram for the half adder circuit of FIG. 14A.

FIG. 14A depicts an illustrative two-phase, mCell-based implementation of a half adder circuit. As with FIG. 12B, the phase designations (P1/P2) in FIG. 14A identify the phase on which each labeled gate activates its evaluation path. FIG. 14B provides a timing diagram for the logic of FIG. 14A. As persons skilled in the art will appreciate, FIG. 14A conveys multiple, alternative implementations in each of the above-enabled forms: (1) single-ended, passive load; (2) single-ended, complimentary; (3) differential, passive load; and (4) differential, complimentary. Additionally, as previously noted, systems such as FIG. 14A can be implemented using a mixture of these and other logic styles at different gates or stages.

Figure 15A:
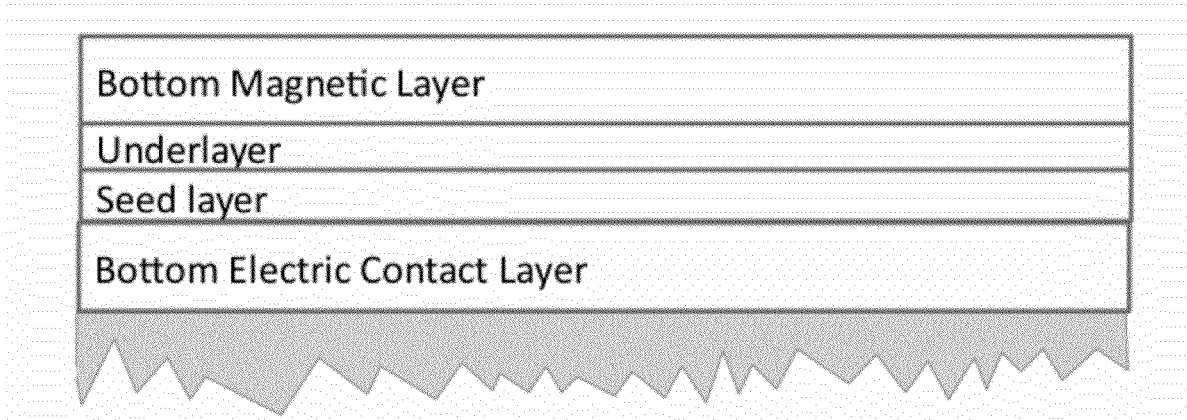
FIGS. 15A-J depict various steps in an illustrative monolithic fabrication process for making integrated mCell-based systems.

Reference is now made to FIGS. 15A-I depict various steps in an illustrative monolithic fabrication process for making integrated mCell-based systems. FIG. 15A depicts:

Deposition of bottom electrode (e.g. Cu, CuN, or Cu/Ta bi-layer repeats);
Deposition of a seed layer or seed layers, such as Ta, NiW, Cr, and/or Ru;
Deposition of a underlayer(s), such as Ru, Cu, Pt, Pd, Cr, TiN, MgO, and/or RuAl;
Deposition of the bottom magnetic layer with perpendicular anisotropy, such as Co, CoPt, CoPd, FePt L10.

Figure 15B:
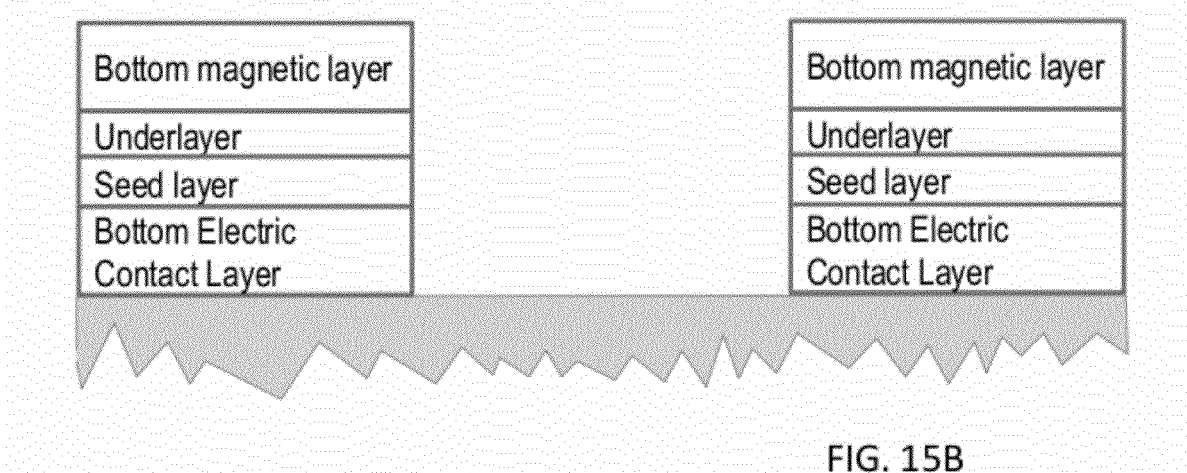

FIG. 15B depicts lithographic patterning to create the bottom magnetic pinning studs.

Figure 15C:
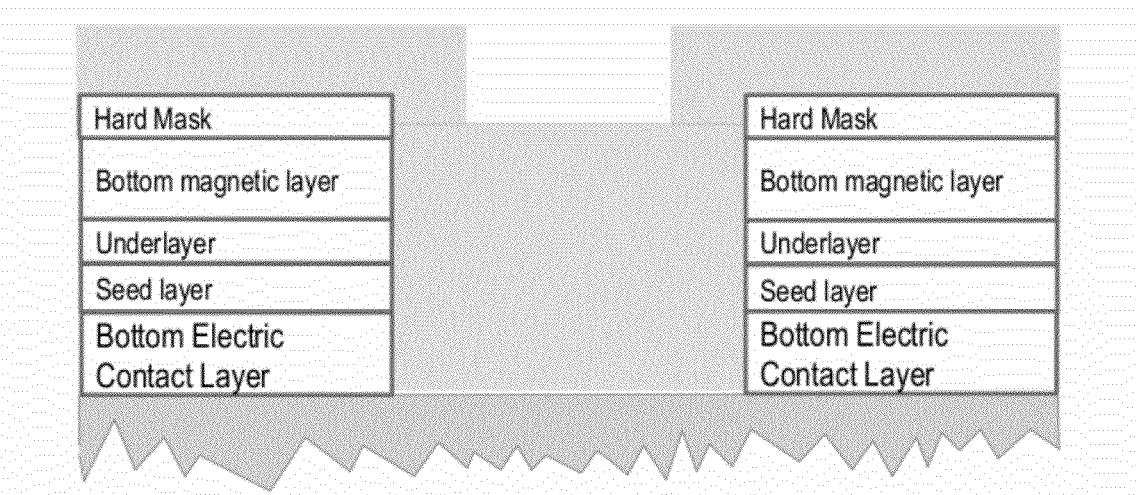

FIG. 15C depicts deposition of SiNx or SiOx layer to cover the structure in preparation for the chemical-mechanical-polishing (CMP) process that follows.

Figure 15D:
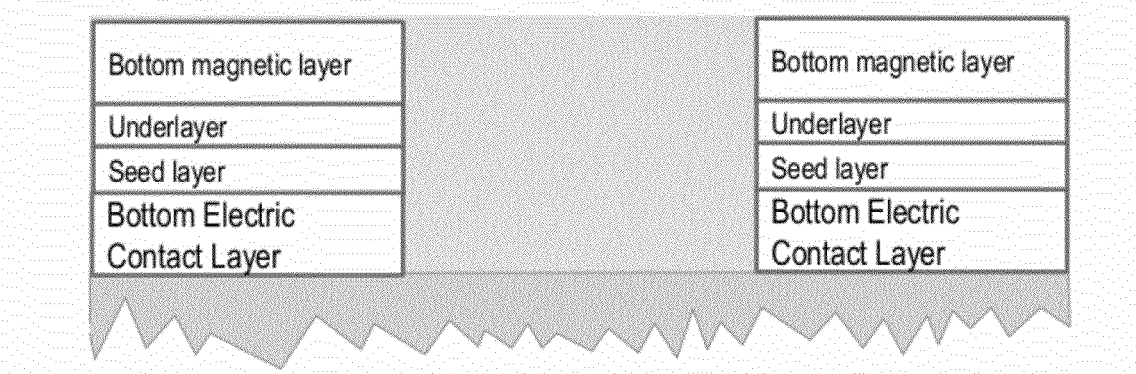

FIG. 15D depicts:
External field setting of the magnetic orientation in the permanent magnet studs;
CMP to planarize the wafer and to expose the permanent magnet studs.

Figure 15E:
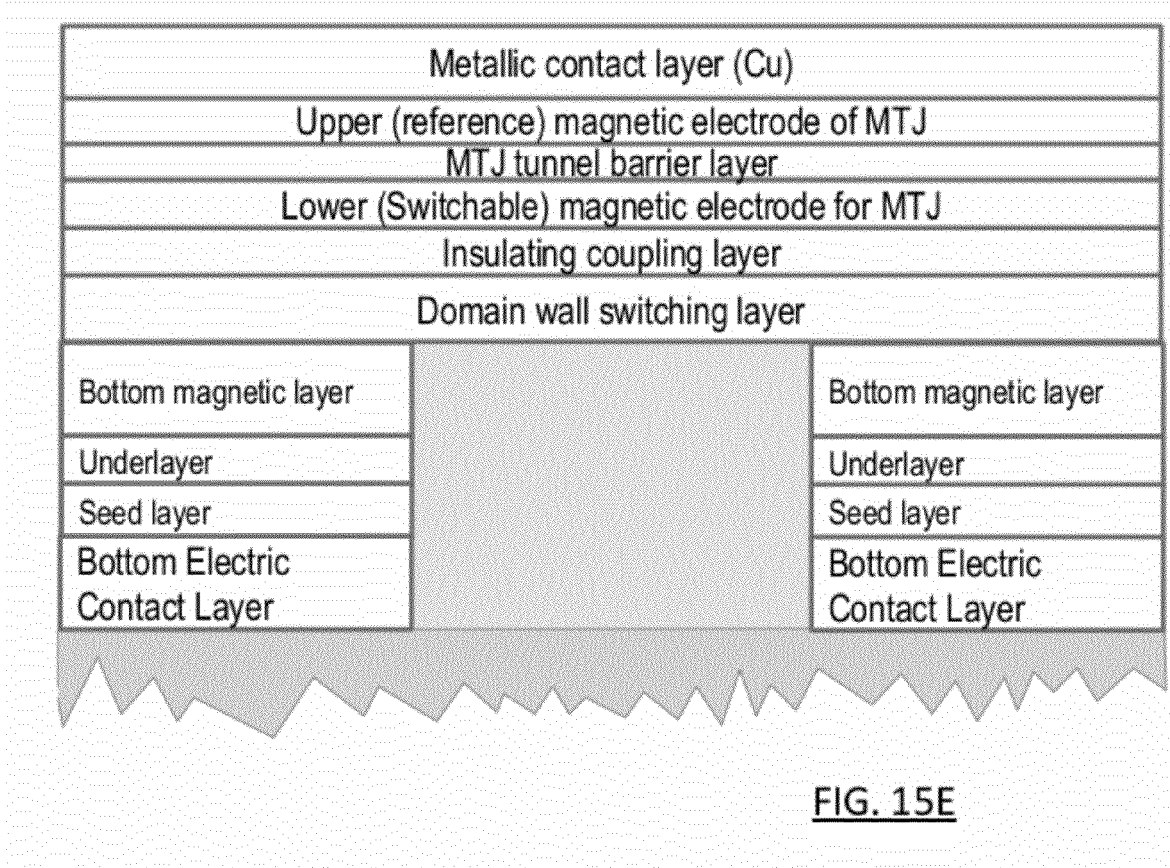

FIG. 15E depicts:
Deposition of the domain wall switching layer;
Deposition of the insulating coupling layer;
Deposition of the MTJ lower magnetic electrode layer;
Deposition of the MTJ tunnel barrier;
Oxygen treatment of the tunnel barrier;
Deposition of the upper magnetic electrode of the MTJ (which may consist of a multilayer structure stack);
Deposition of the top metallic electrical contact layer.

Figure 15F:
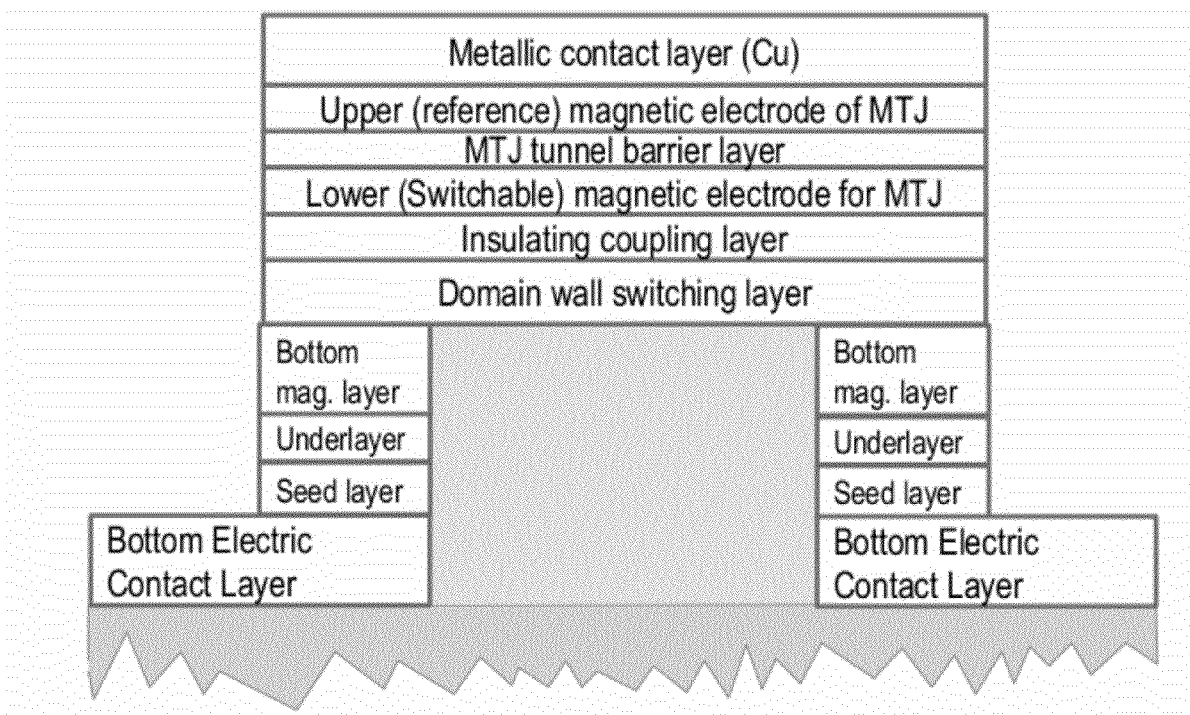

FIG. 15F depicts lithographic patterning of the stack to create the bottom electrical contacts for Terminals (a+ and a−).

Figure 15G:
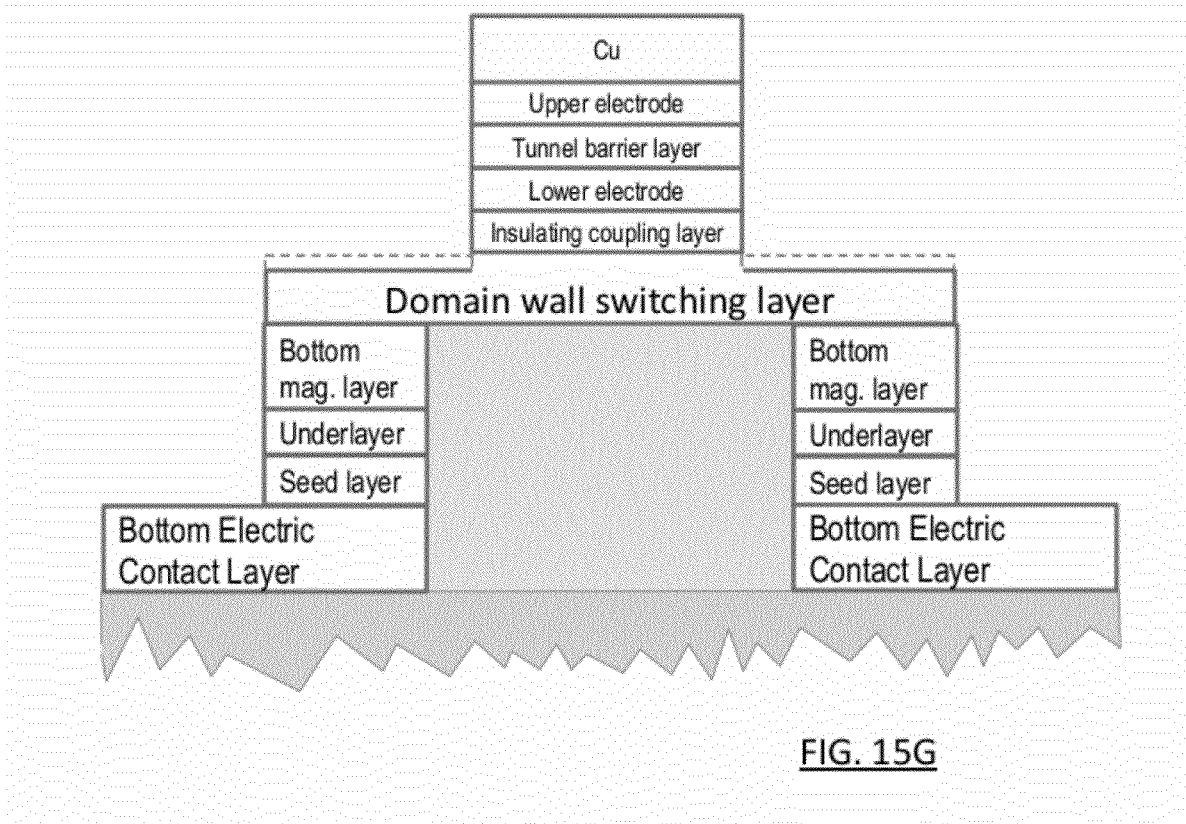

FIG. 15G depicts the lithographic patterning to create the MTJ stack. The etching preferably extends through a controlled depth of the domain wall switching layer to create a step in said layer.

Figure 15H:
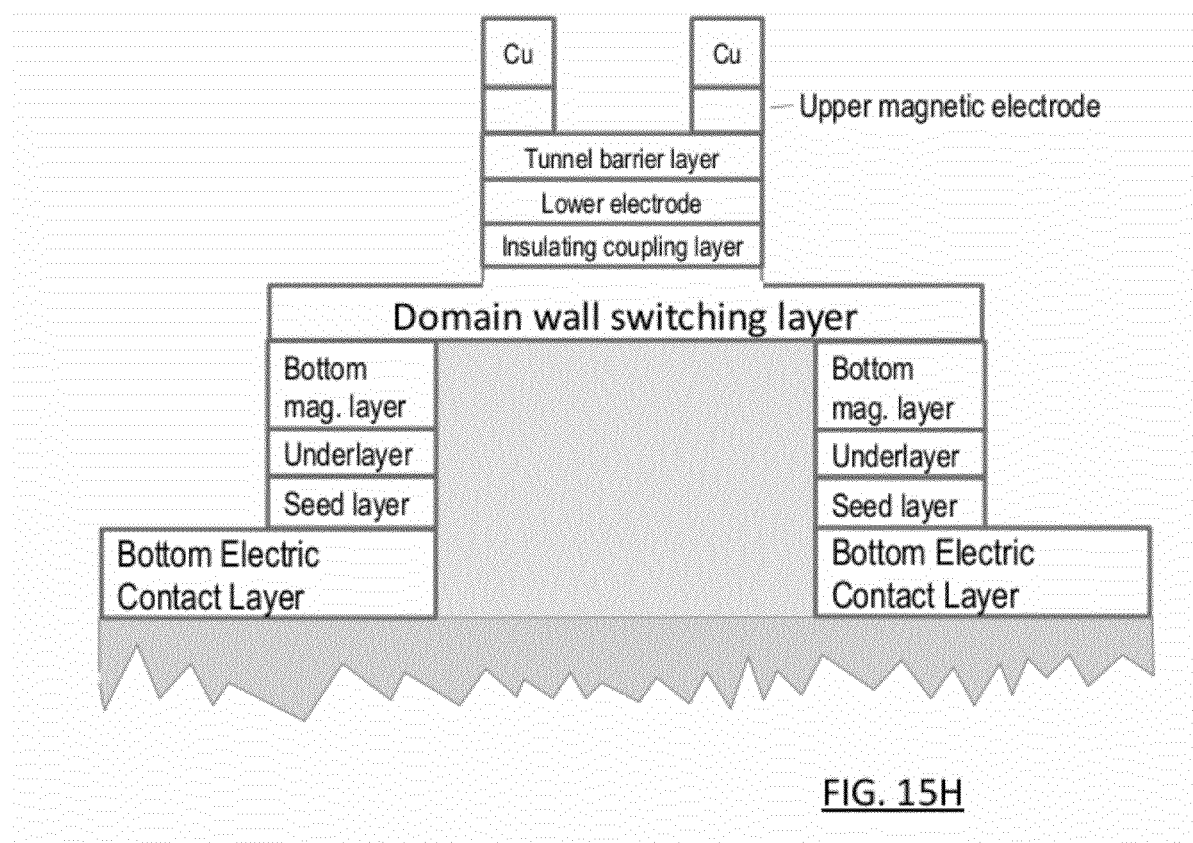

FIG. 15H depicts the lithographic patterning of the top electrical terminals.

Figure 15I:
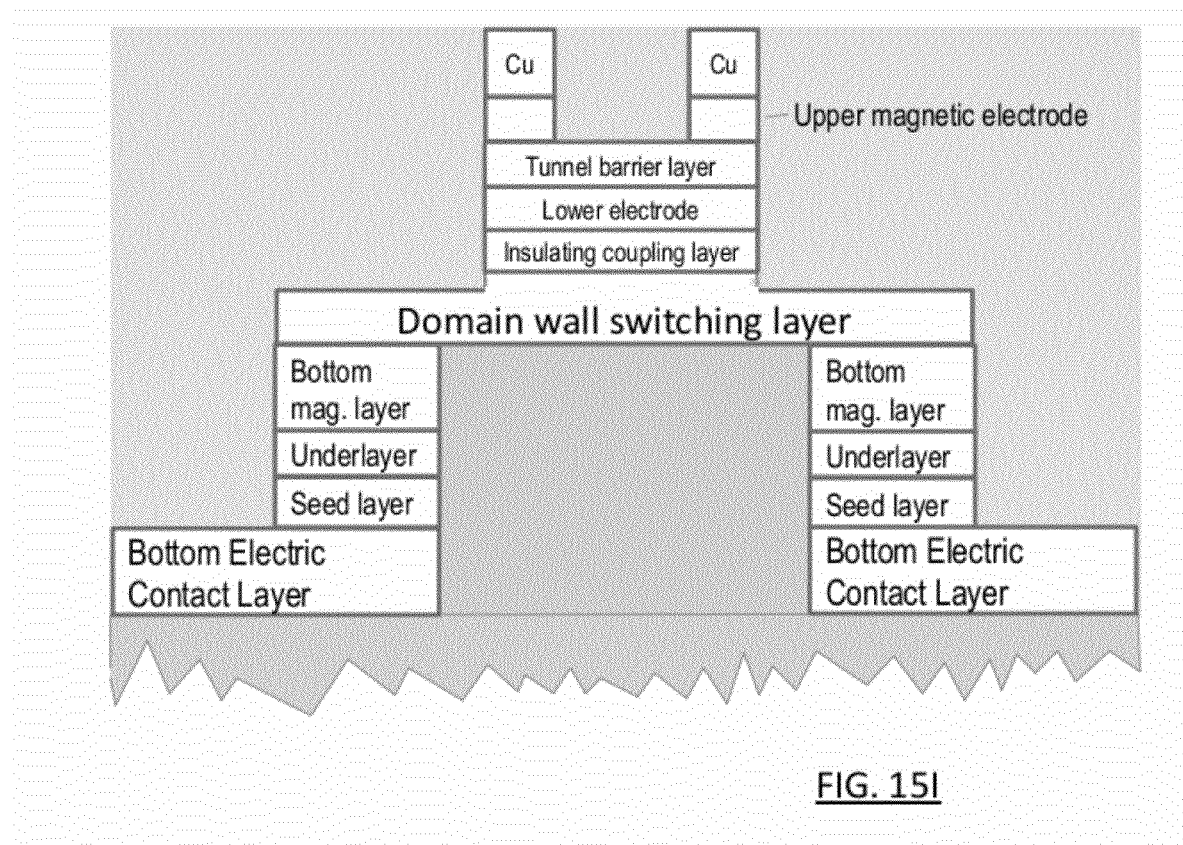

FIG. 15I depicts the deposition of SiNx or SiOx layer, followed by another CMP process.

Figure 15J:
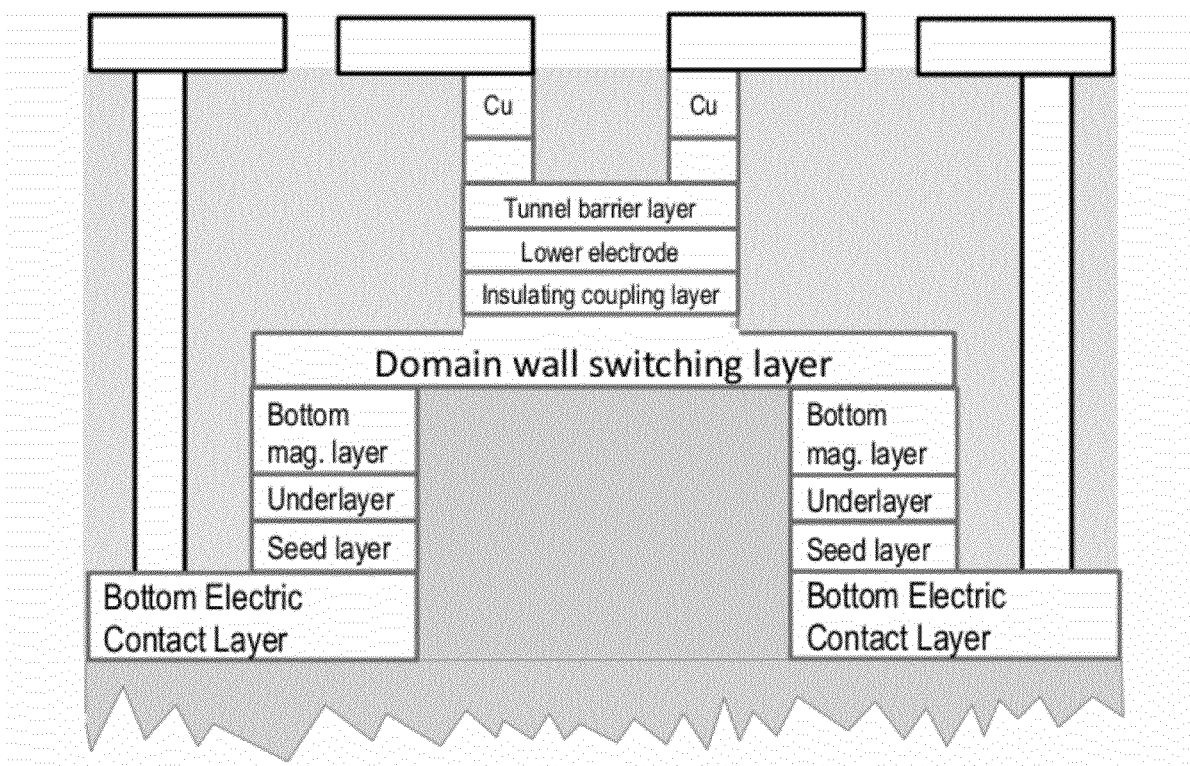

FIG. 15J depicts the lithographic process to create the electrical contact pads for both top and bottom electrical terminals.

While the foregoing discussion and drawings have illustrated several examples of the invention and its application, the potential application of these teachings is very broad and not easily enumerated. By way of example and not exhaustion or limitation, a person skilled in the art would readily recognize that complimentary devices can be constructed using the in-plane designs, and that devices can utilize a combination of perpendicular and in-plane magnetic coupling can be constructed. Accordingly, this invention shall in no way be limited to or by the specific illustrative embodiments, but rather only by the claims and their equivalents. Furthermore, it should be understood that, as used in the claims below, a requirement stating that region Ws magnetization "follow" the magnetization of region A does not necessarily require that region Ws magnetization be aligned with that of region A. Rather, such language, as used herein, merely requires that when the magnetization of region A changes, it produces a predictable, corresponding change in the magnetization of region B.

What is claimed is:

1. A nonvolatile magnetic switching cell (mCell) having (i) first and second programming terminals for switching the mCell between low and high resistance states in response to currents that flow between said programming terminals and (ii) first and second evaluation terminals that present (a) a first, lower resistance when the mCell is in the low resistance state and (b) a second, higher resistance when the mCell is in the high resistance state, said mCell comprising:

first and second magnetized programming electrodes electrically coupled to said respective first and second programming terminals, said first programming electrode having a magnetization substantially opposite to that of said second programming electrode;

a magnetic switching layer made from a conductive material with perpendicular magnetic anisotropy, said magnetic switching layer having (i) a first region adjacent said first programming electrode, (ii) a second region adjacent said second programming electrode, and (iii) a domain switching region located between said first and second regions;

said first region of said magnetic switching layer electrically coupled to said first programming electrode such that current can flow between said first region and said first programming electrode and magnetically coupled such that the magnetization in said first region is pinned by said magnetization of said first programming electrode;

said second region of said magnetic switching layer electrically coupled to said second programming electrode such that current can flow between said second region and said second programming electrode and magnetically coupled such that the magnetization in said second region is pinned by said magnetization of said second programming electrode;

said pinned, opposing magnetizations in said first and second regions of said magnetic switching layer creating a domain wall in said domain switching region of said magnetic switching layer, said magnetic switching layer configured such that (i) currents flowing from said first programming electrode to said second programming electrode cause said domain wall to position itself proximate to said first region of said magnetic switching layer, thereby causing most of said domain switching region to assume said magnetization of said second region and causing said mCell to assume said low resistance state, and (ii) currents flowing from said second programming electrode to said first programming electrode cause said domain wall to position itself proximate to said second region of said magnetic switching layer, thereby causing most of said domain switching region to assume said magnetization of said first region and causing said mCell to assume said high resistance state;

a switchable magnetic evaluation layer, electrically isolated from and magnetically coupled to said domain switching region of said magnetic switching layer, such that said switchable magnetic evaluation layer follows the magnetization of said domain switching region of said magnetic switching layer;

at least a first magnetized evaluation electrode, said first evaluation electrode electrically coupled between said first evaluation terminal and said magnetic evaluation layer; and, at least one magnetic tunnel junction interposed between said first evaluation electrode and said magnetic evaluation layer, such that currents which flow between said evaluation terminals through said magnetic evaluation layer pass through said at least one tunnel junction.

2. An mCell according to claim 1, further comprising:

a second magnetized evaluation electrode, said second evaluation electrode electrically coupled between said second evaluation terminal and said magnetic evaluation layer; and, a second magnetic tunnel junction interposed between said second evaluation electrode and said magnetic evaluation layer, such that currents which flow between said evaluation terminals through said magnetic evaluation layer also pass through said second tunnel junction.

3. A complimentary magnetic switching cell (c-mCell) comprising:

a first programming terminal;

a second programming terminal;

a first magnetized programming electrode electrically coupled to said first programming terminal;

a second magnetized programming electrode electrically coupled to said second programming terminal, said second programming electrode having a magnetization substantially the same as that of said first programming electrode;

an intermediate magnetized programming electrode, said intermediate programming electrode having a magnetization substantially opposite to that of said first and second programming electrodes;

a magnetic switching layer made from a conductive material with perpendicular magnetic anisotropy, said magnetic switching layer having (i) a first region adjacent said first programming electrode, (ii) a second region adjacent said second programming electrode, (iii) an intermediate region adjacent said intermediate programming electrode, (iv) a first domain switching region located between said first and intermediate regions, and (v) a second domain switching region located between said second and intermediate regions;

said first region of said magnetic switching layer electrically coupled to said first programming electrode such that current can flow between said first region and said first programming electrode and magnetically coupled such that the magnetization in said first region is pinned by said magnetization of said first programming electrode;

said second region of said magnetic switching layer electrically coupled to said second programming electrode such that current can flow between said second region and said second programming electrode and magnetically coupled such that the magnetization in said second region is pinned by said magnetization of said second programming electrode;

said intermediate region of said magnetic switching layer at least magnetically coupled with said intermediate programming electrode such that the magnetization in said intermediate region is pinned by said magnetization of said intermediate programming electrode;

said pinned, opposing magnetizations in said first and intermediate regions of said magnetic switching layer creating a first domain wall in said first domain switching region of said magnetic switching layer, said magnetic switching layer configured such that (i) currents flowing from said first programming electrode to said second programming electrode cause said first domain wall to position itself proximate to said first region of said magnetic switching layer, thereby causing most of said first domain switching region to assume said magnetization of said intermediate region and causing said c-mCell to assume a first output state, and (ii) currents flowing from said second programming electrode to said first programming electrode cause said first domain wall to position itself proximate to said intermediate region of said magnetic switching layer, thereby causing most of said first domain switching region to assume said magnetization of said first region and assisting said c-mCell to maintain a second output state;

said pinned, opposing magnetizations in said second and intermediate regions of said magnetic switching layer creating a second domain wall in said second domain switching region of said magnetic switching layer, said magnetic switching layer also configured such that (i) said currents flowing from said second programming electrode to said first programming electrode cause said second domain wall to position itself proximate to said second region of said magnetic switching layer, thereby causing most of said second domain switching region to assume said magnetization of said intermediate region and assisting said c-mCell to maintain said first output state, and (ii) said currents flowing from said first programming electrode to said second programming electrode cause said second domain wall to position itself proximate to said intermediate region of said magnetic switching layer, thereby causing most of said second domain switching region to assume said magnetization of said second region and causing said c-mCell to assume said second output state;

a first switchable magnetic evaluation layer, electrically isolated from and magnetically coupled to said first domain switching region of said magnetic switching layer, such that said first switchable magnetic evaluation layer follows the magnetization of said first domain switching region of said magnetic switching layer;

at least a first magnetized evaluation electrode, said first evaluation electrode electrically coupled between either (i) a first supply terminal and said first magnetic evaluation layer or (ii) an output terminal and said first magnetic evaluation layer;

at least a first magnetic tunnel junction interposed between said first evaluation electrode and said first magnetic evaluation layer, such that currents which flow between said first supply terminal and said output terminal through said first magnetic evaluation layer pass through said at least one first tunnel junction;

a second switchable magnetic evaluation layer, electrically isolated from and magnetically coupled to said second domain switching region of said magnetic switching layer, such that said second switchable magnetic evaluation layer follows the magnetization of said second domain switching region of said magnetic switching layer;

at least a second magnetized evaluation electrode, said second evaluation electrode electrically coupled between either (i) a second supply terminal and said second magnetic evaluation layer or (ii) said output terminal and said second magnetic evaluation layer; and, at least a second magnetic tunnel junction interposed between said second evaluation electrode and said second magnetic evaluation layer, such that currents which flow between said second supply terminal and said output terminal through said second magnetic evaluation layer pass through said second tunnel junction.

\* \* \* \* \*